(12) United States Patent
Hatano et al.

(10) Patent No.: US 7,067,897 B2
(45) Date of Patent: Jun. 27, 2006

(54) SEMICONDUCTOR DEVICE

(75) Inventors: Masaaki Hatano, Yokohama (JP); Hiroshi Ikegami, Hiratsuka (JP); Takamasa Usui, Fujisawa (JP); Mie Matsuo, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/365,630

(22) Filed: Feb. 13, 2003

(65) Prior Publication Data

US 2003/0155590 A1 Aug. 21, 2003

(30) Foreign Application Priority Data

Feb. 19, 2002 (JP) ............................ 2002-041974

(51) Int. Cl.
*H01L 29/00* (2006.01)

(52) U.S. Cl. .............. 257/529; 257/665; 257/758; 257/760; 438/132; 438/215; 438/281; 438/333; 438/467; 438/601

(58) Field of Classification Search ............... 257/173, 257/210, 529, 665, 758–760, 910; 438/132, 438/215, 281, 333, 467, 601, 128, 129, 902, 438/118, 622–624
See application file for complete search history.

(56) References Cited

U.S. PATENT DOCUMENTS

| 4,536,949 | A | * | 8/1985 | Takayama et al. ............ 29/578 |
| 5,025,300 | A | * | 6/1991 | Billig et al. ................. 257/529 |
| 5,754,089 | A | * | 5/1998 | Chen et al. |
| 5,872,390 | A | * | 2/1999 | Lee et al. ................... 257/529 |
| 6,054,339 | A | * | 4/2000 | Gilmour et al. |
| 6,061,264 | A | * | 5/2000 | Giust et al. |
| 6,163,062 | A | * | 12/2000 | Shiratake et al. ............ 257/529 |
| 6,242,789 | B1 | | 6/2001 | Weber et al. |
| 6,294,474 | B1 | * | 9/2001 | Tzeng et al. ................ 438/710 |
| 6,376,894 | B1 | | 4/2002 | Ikegami et al. |
| 6,586,815 | B1 | | 7/2003 | Ohhashi |

FOREIGN PATENT DOCUMENTS

| CN | 1275807 A | | 12/2000 |
| JP | 57-075442 | | 5/1982 |
| JP | 10-229086 | | 8/1998 |
| JP | H11-163147 | | 6/1999 |
| JP | 11-163147 | * | 6/1999 |
| JP | 2000-269342 | | 9/2000 |
| JP | 2002269342 | | 9/2000 |

OTHER PUBLICATIONS

U.S. patent application Ser. No. 09/199,689, Ohhashi, filed Nov. 1998.*

(Continued)

*Primary Examiner*—David Nelms
*Assistant Examiner*—Andy Huynh
(74) *Attorney, Agent, or Firm*—Finnegan, Henderson, Farabow, Garrett & Dunner, L.L.P.

(57) ABSTRACT

A semiconductor device comprising a substrate, a plurality of dielectric films formed on the substrate, laid one upon another, and a fuse interconnect-wire formed above the substrate and covered with a predetermined one of the dielectric films, and including a fuse main body which is to be blown to electrically disconnect the fuse interconnect-wire, which is smaller than a bottom of a fuse-blowing recess made in the predetermined dielectric film, which has a length not less than the diameter of a fuse-blowing laser beam and which opposes the bottom of the fuse-blowing recess.

20 Claims, 11 Drawing Sheets

OTHER PUBLICATIONS

Ohhashi, H., "Semiconductor Device Having Dummy Interconnection and Method for Manufacturing the Same", U.S. application No. 09/199,689 filed Nov. 25, 1998.

Hatano, M. et al., "Semiconductor Device", U.S. application No. 09/816,177 filed Mar. 26, 2001.

Ikegami, H., "Semiconductor Device", U.S. application No. 10/165,982, filed Jun. 11, 2002.

Office Action issued by Taiwan Patent Office on Sep. 2, 2004, in a counterpart application, and English translation of office action.

English–language translation of Office Action dated May 7, 2004, from the Japanese Patent Office in Japanese Application No. 029547/2003.

People's Republic of China Patent Office Notification of the First Office Action In counterpart foreign application 03103665.1, and English translation thereof.

Hatano, M. et al., "Semiconductor Device", U.S. Appl. No. 09/816,177, filed Mar. 26, 2001.

Ikegami, H., "Semiconductor Device", U.S. Appl. No. 10/165,982, filed Jun. 11, 2002.

* cited by examiner

SEMICONDUCTOR DEVICE

CROSS-REFERENCE TO RELATED APPLICATIONS

This application is based upon and claims the benefit of priority from the prior Japanese Patent Application No. 2002-041974, filed on Feb. 19, 2002, the entire contents of which are incorporated herein by reference.

BACKGROUND OF THE INVENTION

1. Field of the Invention

The present invention relates to the structure of interconnect-wires in a semiconductor device. More specifically, the invention relates to improvements in the interconnection pattern and structure of fuse interconnect-wires in an LSI chip.

2. Description of the Related Art

Semiconductor devices are generally known, which have a redundancy circuit for disabling defects components, if any. Most redundancy circuits have fuse interconnect-wires. The fuse interconnect-wires may be blown when applied with a laser beam, to disconnect the defective components from the normally functioning components.

Here, the fuse interconnect-wires and some associated components, all incorporated in a semiconductor device, for example, an LSI chip, will be described briefly with reference to FIGS. 21, 22, and 23. FIG. 21 is a sectional view of an LSI chip, taken along the width of fuse interconnect-wires. FIG. 22 is a sectional view taken along line X—X in FIG. 21, more precisely a sectional view taken in the lengthwise direction of the fuse interconnect-wires. FIG. 23 is a plan view of the LSI chip looked from above, showing the fuse interconnect-wires and the associated components.

A multi-layered interconnect-wire structure is formed on a silicon substrate 101. FIG. 21 typically illustrates two layers of interconnect-wires 102: the topmost layer and the underlying layer. Each interconnect-wire is generally formed of Cu or Al and Cu is used in this example. Pads 103a are generally formed of AlCu, Cu, or a composite. In this case, pads 103a are formed of Cu.

On the substrate 101 there are provided a plurality of interlayer insulating films 104 each of which is separated from the adjacent one by a diffusion barrier film 105. For the Cu interconnect-wires 102, each of the interlayer insulating films 104 is generally made of a plasma-deposited $SiO_2$ film, a low-k (low relative permittivity) dielectric film, a silicon nitride film, or a composite film thereof. In this example, each interlayer insulating film is formed of plasma-deposited $SiO_2$. For the Cu interconnect-wires 102, to prevent the diffusion of Cu, each of the diffusion barrier films 105 is generally formed of silicon nitride, silicon carbide (SiC), silicon carbonitride (SiCN), or a material having substantially the same properties as these materials. In this example, each diffusion barrier film is made of silicon nitride. The topmost interlayer insulating film 104 and the underlying Cu diffusion barrier film 105 are formed as a so-called passivation film 106.

Between each Cu interconnect-wire 102 and the $SiO_2$ film 104 is provided a barrier metal film 107, which is a film consisting of a refractory metal such as Ta, Nb, W, or Ti, a film consisting of a nitride of one of such metals, or a composite film of refractory metal/refractory metal nitride.

With LSI chips of the multi-layered interconnect-wire structure, the Cu interconnect-wires at the second layer and any upper layer are generally formed by dual damascene process, single damascene process, or RIE process. The Cu interconnect-wires 102a and pads 103a, all provided on the uppermost layer, have been formed by dual damascene process and are integral with a via plug 108 by the dual damascene process. Thus, the Cu interconnect-wires 102a and pads 103a have so-called "dual damascene structure."

With LSI chips of the multi-layered interconnection structure, fuse interconnect-wires are generally provided in a layer or layers below the topmost layer. For example, as shown in FIG. 21, some of the Cu interconnect-wires 102 which are located one layer below the topmost layer are used as fuse interconnect-wires 103. A so-called fuse window is provided above the Cu fuse interconnect-wires 103 in order to make it easy to disconnect a predetermined fuse interconnect-wire or wires. In order to reduce the process cost of manufacture of LSI chips, the fuse window 109 is generally formed concurrently with etching the top-level interlayer insulating film 104 to expose the pads 103a for the top-level interconnect-wires.

Since the Cu fuse interconnect-wires 103 are subject to oxidation, it is not desirable to open fully the bottom 110 of the fuse window 109 to thereby expose the surface of the Cu fuse interconnect-wires 103. In order to facilitate fuse blow, however, it is required to reduce the thickness of the $SiO_2$ film 104 and the Cu diffusion barrier film 105 which are left over the Cu fuse interconnect-wires 103. Therefore, the fuse window 109 is formed so that the remaining film 104 between the bottom 110 and the surface of the Cu fuse interconnect-wires 103 has as small a thickness as possible.

In forming the fuse window 109, etching characteristics will make it easy for the top of the bottom 110 to be shaped into an arch-like form as shown in FIGS. 21 and 22. As a result, a so-called trenching phenomenon may occur in the periphery of the bottom 110 of the fuse window 109 by which the surface of the Cu fuse interconnect-wires 103 is partly exposed as shown in FIGS. 22 and 23. When the surface of the Cu fuse interconnect-wires 103 is partly exposed, they will be oxidized from the exposed portions. As a result, the resistance of the Cu fuse interconnect-wires 103 increases, degrading their quality. This may also cause the overall quality of the LSI chip to suffer. On the other hand, the etching characteristic makes it very difficult to improve the shape of the bottom 110 of the fuse window 109 so as not to expose the Cu interconnect-wires with the remaining film 104 over the interconnect-wires being formed small in thickness, thereby preventing oxidation of the Cu fuse interconnect-wires 103.

Etching so as not to expose the surface of the Cu fuse interconnect-wires 103 will increase the thickness of the remaining film 104 on the Cu fuse interconnect-wires 103. This will require an increase in the energy of laser beams needed to blow the fuses. Increasing the laser beam energy may damage a Cu fuse interconnect-wire adjacent to a target fuse interconnect-wire to be disconnected. This may lower the reliability of all the fuse interconnect-wires 103. To prevent this, it is required to set the spacing between adjacent fuse interconnect-wires (the fuse pitch) to a predetermined value or more. Specifically, it is required to set the fuse pitch to not less than a limiting value defined by the laser beam energy, i.e., the processing accuracy of laser beams. Thereby, it becomes possible to irradiate only a target fuse interconnect-wire or wires to be disconnected with a laser beam.

As described above, increasing the thickness of the remaining film 104 results in restrictions on the arrangement of the Cu fuse interconnect-wires 103; that is, limitations are encountered in making the pitch of the interconnect-wires finer. The limitations will reduce the number of the fuse interconnect-wires 103 to be incorporated into LSI chips. This reduces the rate at which chips are relieved through fuse blow, i.e., the manufacturing yield of LSI chips. Increasing the thickness of the remaining film 104 needs increasing the output power of laser beams or their fine processing accuracy. This may result in an increase in the process cost of LSIs.

In recent years, with microstructuring of and increasing packing density of semiconductor devices, various electronic circuits within the semiconductor devices have also been scaled down in dimensions and increased in packing density. This has accompanied an increase in the number of fuse interconnect-wires. With such a fuse interconnect-wire structure as shown in FIG. 23, in order to increase the number of the fuse interconnect-wires 103, it is required to increase the size of the fuse interconnect-wire area. As a result, the area occupied by the fuse interconnect-wire area in a semiconductor device increases, resulting in a reduction in the scale of a saving circuit that can be built into the device. For this reason, the chip saving rate may be lowered.

To increase the number of the fuse interconnect-wires 103, they are made finer rather than making the fuse interconnect-wire area larger. This will result in exposed portions of the fuse interconnect-wires becoming easy to be oxidized when the periphery of the bottom 110 of the fuse window 109 is opened. That is, LSI chips become easy to suffer deterioration in quality. When the number of the fuse interconnect-wires 103 is increased without making the fuse interconnect-wire area large, the fuse pitch may be decreased imprudently below the limit defined by the laser beam processing accuracy. This will make the fuse interconnect-wires 103 easy to be damaged by fuse blow as described above, lowering their reliability.

BRIEF SUMMARY OF THE INVENTION

According to an aspect of the present invention, there is provided a semiconductor device comprising: a substrate; a plurality of dielectric films formed on the substrate, laid one upon another; and a fuse interconnect-wire formed above the substrate and covered with a predetermined one of the dielectric films, and including a fuse main body which is to be blown to electrically disconnect the fuse interconnect-wire, which is smaller than a bottom of a fuse-blowing recess made in the predetermined dielectric film, which has a length more than the diameter of a fuse-blowing laser beam and which opposes the bottom of the fuse-blowing recess.

According to another aspect of the present invention, there is provided a semiconductor device comprising: a plurality of dielectric films formed on a substrate, laid one upon another; and a fuse interconnect-wire which is formed above the substrate and covered with a predetermined one of the dielectric films, and which comprises a fuse lead and a fuse main body electrically connected to the fuse lead, the fuse main body lying below a bottom of a fuse-blowing recess made in the predetermined dielectric film and above the fuse lead, having a length more than the diameter of a fuse-blowing laser beam, and having both ends within an area opposite the bottom of the fuse-blowing recess, the both ends being spaced apart in the lengthwise direction of the fuse main body.

According to still another object of the present invention, there is provided a semiconductor device comprising: a plurality of dielectric films formed on a substrate, one laid upon another; and a fuse interconnect-wire which is formed above the substrate and covered with a predetermined one of the dielectric films, and which comprises a fuse lead and a fuse main body electrically connected to the fuse lead, the fuse main body lying below a bottom of a fuse-blowing recess formed in the predetermined dielectric film, being provided in the same layer as the fuse lead, having a length more than the diameter of a fuse-blowing laser beam and a width not less than that of the fuse lead, and having both ends within an area opposite the bottom of the fuse-blowing recess, the both ends being spaced apart in the lengthwise direction of the fuse main body.

DETAILED DESCRIPTION OF THE INVENTION

Embodiments of the present invention will be described, with reference to the accompanying drawings.

[First Embodiment]

FIGS. 1 to 5 are sectional views of the LSI, explaining some steps of manufacturing the LSI as a semiconductor device according to the first embodiment. FIGS. 1 to 5 shows only one fuse interconnection-wire 1. Nonetheless, two or more fuse interconnection-wires may be provided. This holds true of the structures shown in FIGS. 8 to 12, which will be described later. The fuse interconnection-wire 1 is made of Cu and has a fuse main body 2 which is formed integral with a contact plug (via plug) 12. The contact plug 12 connects the main body 2 to a lead 5. Thus, the fuse main body 2 and the contact plug 12 have a so-called "dual damascene structure."

Figure 1:
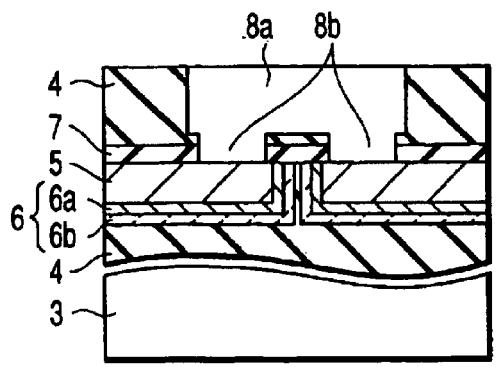
FIG. 1 is a sectional view, explaining some steps of manufacturing a semiconductor device according to the first embodiment.

First, as shown in FIG. 1, an Si substrate 3 has been formed with active devices (not shown) and multi-layered interconnect-wires (not shown) which make up various electronic circuits. The substrate 3 provided on top with the n-th layer (n is a positive integer) of inter-level dielectric film (ILD film) 4. The Cu fuse interconnect-wires 1 (described later) are formed in a predetermined interconnection pattern on the substrate 3 to be electrically connected to various electronic circuits. In general, inter-level dielectric films including the n-th layer of dielectric film 4 are made of an $SiO_2$ film (TEOS film), a dielectric film of low relative permittivity (low-k dielectric film), or stacked $SiO_2$/low-k dielectric films. The $SiO_2$ film may be formed by, for example, plasma-enhanced CVD. In this embodiment, each inter-level dielectric film is formed of $SiO_2$.

Next, a lead 5 for Cu fuse that forms a part of the Cu fuse interconnect-wire 1 is formed in the n-th layer of inter-level dielectric film 4. First, the inter-level dielectric film 4 is etched in a predetermined interconnection pattern to form a recess (groove) not shown for formation of the Cu lead 5 as the lower-layer interconnect-wire. Subsequently, a barrier film (barrier metal film) 6 is formed in that recess to suppress the diffusion of Cu, the material for the Cu lead 5, into the inter-level dielectric film 4. In this embodiment, the barrier film 6 is a two-layered structure consisting of a Ta layer 6a and a TaN layer 6b. From a consideration of chemical compatibility between materials for the barrier film 6 and the Cu lead 5, the Ta layer 6a is formed as the inner layer that is in direct contact with the Cu lead 5 and the TaN layer 6b as the outer layer.

Subsequently, a film the main ingredient of which is Cu that forms the seed of the Cu lead 5 is formed on the barrier film 6 and the Cu lead 5 is then formed by means of electro-plating. After that, excess Cu and barrier materials attached to the outside of the recess are removed using CMP. Thus, the Cu lead 5 is formed in the n-th layer of inter-level dielectric film 4.

Next, the m-th layer of Cu diffusion barrier film 7 (m is a positive integer), which is a kind of insulating film, is formed on the n-th layer of inter-level dielectric film 4 to prevent the diffusion of Cu contained in the Cu lead 5. In general, the Cu diffusion barrier films including the m-th layer of diffusion barrier film 7 are each made of a silicon nitride film, a silicon carbide film (SiC), a silicon carbide nitride film (SiCN), or a film having substantially the same characteristics as these films. In this embodiment, each Cu diffusion barrier film 7 consists of a silicon nitride film.

Next, the (n+1)-st layer of inter-level dielectric film 4 is formed on the m-th layer of Cu diffusion barrier film 7. A recess (groove) 8a and a recess (groove) 8b, which will be used to form a Cu fuse main body 2 and a Cu via plug 12, respectively, are then made in the inter-level dielectric film 4. In this embodiment, the fuse main body 2 and the Cu contact plugs (via plugs) 12 are formed integral, forming a dual damascene structure. The recesses 8a and 8b, which are continuous, are made as follows. As in the case where the recess for the lead 5 is formed, the (n+1)-st layer of inter-level dielectric film 4 and the m-th layer of Cu diffusion barrier film 7 are etched according to predetermined interconnect and contact patterns. A portion of the top of the Cu lead 5 is thereby exposed temporarily, thus making the recesses 8a and 8b continuous to each other.

Figure 2:
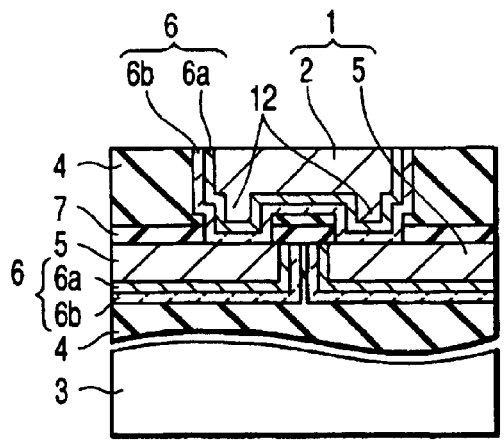
FIG. 2 is a sectional view explaining some other steps of manufacturing the semiconductor device according to the first embodiment.

Next, as shown in FIG. 2, the Cu fuse main body 2 is formed in the recess 8a. The body 2 is a fuse blow target for disconnecting the Cu fuse interconnect-wire 1. Further, a Cu via plug 12 is formed in the recess 8b, to electrically connect the Cu fuse main body 2 to the Cu lead 5. The Cu fuse main body 2 and the Cu via plug 12 are formed in the same way as the Cu lead 5 is formed.

More precisely, a barrier film 6 of a two-layered structure is formed in the groove 8a and grooves 8b. Note that the barrier film 6 comprises a Ta layer 6a and a TaN layer 6b. A film (not shown), which is made mainly of Cu and serves as a seed layer of the Cu fuse main body 2 and Cu via plug 12, is formed on the barrier film 6. The Cu fuse main body 2 is then formed on the film by electro-plating. Thereafter, excess Cu and barrier materials are removed from the outside of the recess 8a and 8b by means of CMP. Thus, the Cu fuse main body 2 of a desirable dual damascene structure is formed in the (n+1)-st layer of inter-level dielectric film 4 and the m-th layer of Cu diffusion barrier film 7.

In this manner, the main part of the Cu fuse interconnect-wire 1 is formed. In this embodiment, the Cu fuse main body 2 is made smaller than the bottom 10 of a recess 9 for fuse blowing to be described later. Specifically, the main body 2 is made smaller in length and width than the bottom 10 of the recess 9. Specifically, the area of the Cu fuse main body 2, as viewed from above, is made sufficiently smaller than the area of the bottom 10 of the fuse blowing recess 9. Further, the length of the Cu fuse main body 2 is made larger than the diameter of a fuse blowing laser beam. The Cu fuse main body 2 is positioned within an area underneath the bottom 10 of the fuse blowing recess 9. In particular, the main body has its both ends along the direction of length positioned within an area underneath the bottom of the recess.

Usually, alignment for disconnecting a fuse interconnect-wire is performed by reading alignment marks formed on a substrate, by using an alignment scope provided independent of a fuse blowing laser beam irradiation optical system. The alignment marks are read, providing the information about position that the substrate takes in horizontal and vertical planes. The information is applied, correcting the coordinates of a fuse interconnect-wire to be disconnected and the focus position of a laser beam to applied to that fuse interconnect-wire. However, variations in the shape of the alignment marks and the thickness of insulating films on the marks may produce a deviation between the corrected focus position and the actual fuse interconnect-wire position. For this reason, the irradiation optical system needs a depth of focus sufficient to allow for at least the deviation.

When the deviation of the laser beam focus position resulting from errors in reading the alignment marks exceeds the depth of focus of the irradiation optical system, the shape of the laser beam directed onto the fuse interconnect-wire may be degraded to cause fuse interconnect-wire disconnection failures. In addition, variations in the thickness of insulating films on the fuse interconnect-wires and variations in the flatness of the substrate may vary the optical length of the laser beam irradiation optical system. This will also cause the problem that the shape of a laser beam is degraded in a portion to be disconnected of a fuse interconnect-wire.

In general, to allow the effect of the deviation of the laser beam focus position on fuse blowing to be kept within an allowable range, the depth of focus of the irradiation optical system must be about 0.7 μm or more, as is known from experience. It is also known that as the depth of focus to be obtained increases, the limitation on the minimum diameter of a laser beam increases. To blow the fuses properly, therefore, the Cu fuse interconnect-wires 1 (Cu fuse main bodies 2) are also subject to limitations on their minimum size (length).

If the length of the Cu fuse main body 2 were less than the minimum diameter of a laser beam, heat required to blow the fuse would run away into the layer or layers below the fuse main body 2. In addition, the Cu lead 5 below the Cu fuse main body 2 might also be blown. If the Cu lead 5 in the lower layer were blown, cracks might be produced in the (n+1)-st layer of inter-level dielectric film 4 existing between the bottom 10 of the fuse window 9 and the underlying Cu lead 5. These might result in failure of the Cu fuse interconnect-wires 1 to be blown properly.

Figure 6:
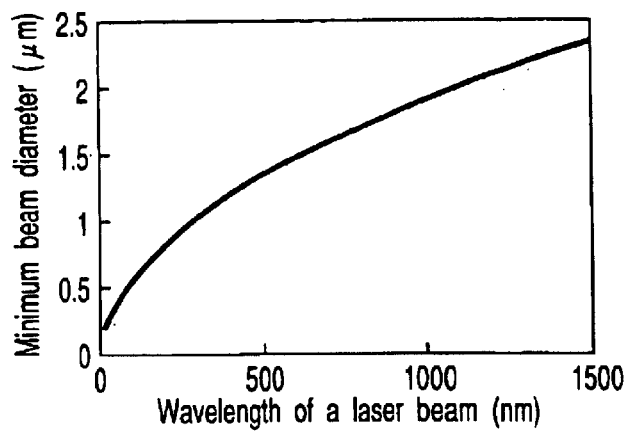
FIG. 6 is a graph illustrating the relation between the wavelength of a laser beam for blowing fuses and the minimum diameter of the laser beam.

FIG. 6 is a graph illustrating the minimum beam diameter as a function of the wavelength of a laser beam for the case where the depth of focus of the fuse blowing laser beam irradiation optical system is set to not less than 0.7 μm. In order to disconnect the Cu fuse interconnect-wire 1 properly without causing excessive damage to layers below the Cu fuse main body 2, the main body has a length that is equal to or larger than the minimum diameter of a laser beam, determined by the wavelength of the beam as shown in FIG. 6.

The Cu via plug 12 is smaller than the Cu fuse main body 2. More specifically, as shown in FIG. 2, the Cu via plug 12 has a diameter equal to or smaller than the width of the Cu fuse main body 2. Moreover, the Cu via plug 12 is formed inside the Cu fuse main body 2. This makes it difficult for heat required to blow the Cu fuse interconnect-wire 1 to dissipate into the layers lying below the fuse main body 2.

Figure 3:
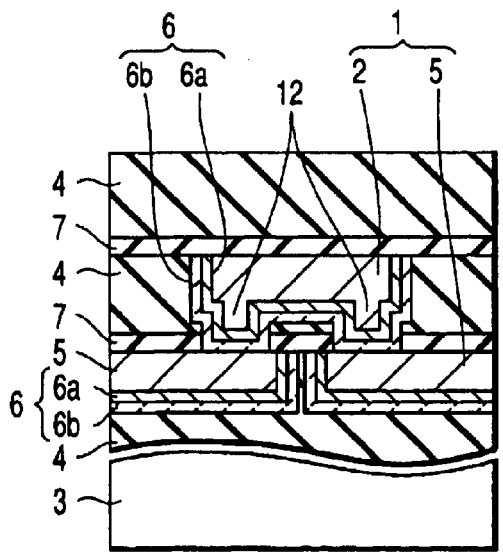
FIG. 3 is a sectional view explaining further steps of steps of manufacturing the semiconductor device according to the first embodiment.
Figure 4:
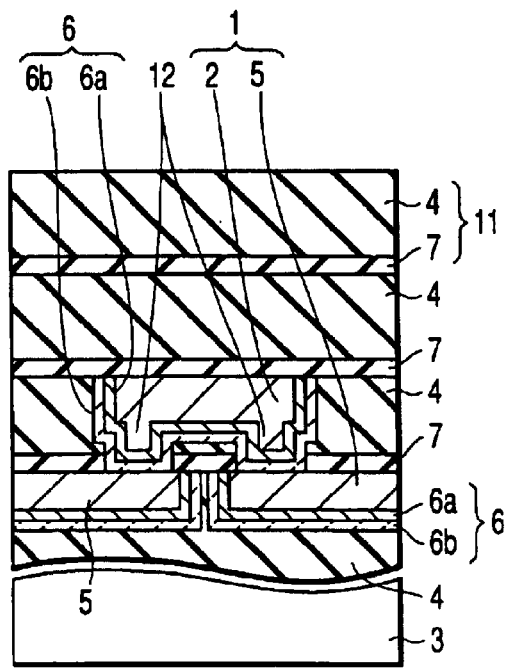
FIG. 4 is a sectional view explaining other steps of manufacturing the semiconductor device according to the first embodiment.
Figure 21:
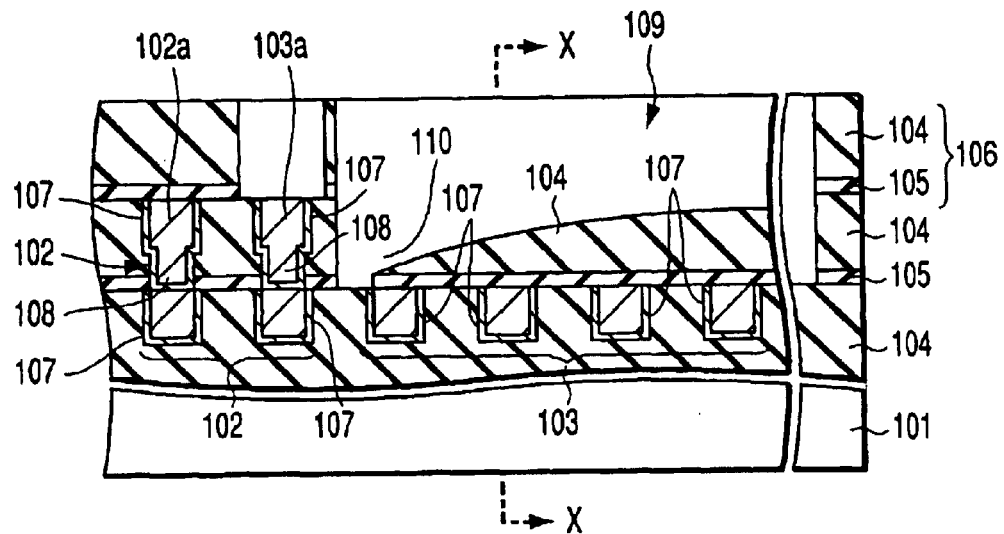
FIG. 21 is a sectional view of a conventional semiconductor device, displaying fuse interconnect-wires and the components provided near the wires.
Figure 22:
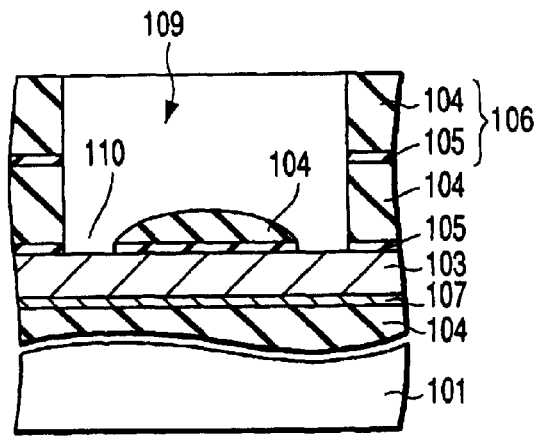
FIG. 22 is a sectional view taken along line X—X in FIG. 21.

Next, as shown in FIG. 3, the (m+1)-st layer of Cu diffusion barrier film 7 and the (n+2)-nd layer of inter-level dielectric film 4 are formed on the Cu fuse main body 2 and the (n+1)-st layer of inter-level dielectric film 4. Though not shown in this embodiment, such interconnect-wires and pads as shown in FIG. 21 are formed in the n-th to (n+2)-nd layers of inter-level dielectrics film 4. These interconnect-wires and plugs are formed in the same way as when the Cu fuse main body 2 and the Cu lead 5 are formed. Subsequently, the (n+2)-nd layer of inter-level dielectric film 4 is formed on top with the (m+2)-nd layer of Cu diffusion barrier film 7 and the (n+3)-rd layer of inter-level dielectric film 4, which act as a passivation film 11.

Figure 5:
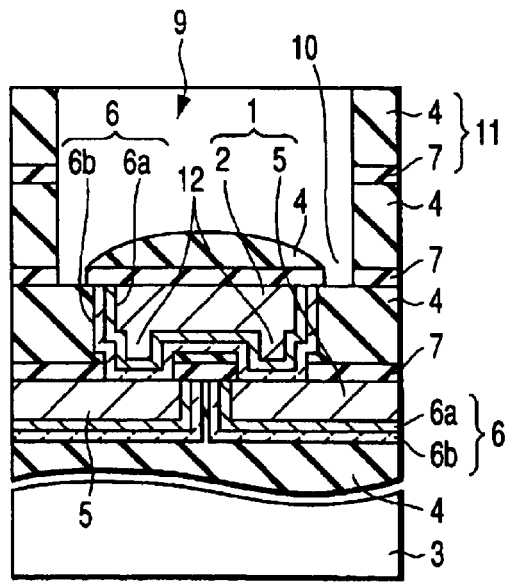
FIG. 5 is a sectional view explaining some other steps of manufacturing the semiconductor device according to the first embodiment.

Next, a recess for facilitating fuse blowing, a so-called fuse window 9 is formed above the Cu fuse main body 2. In general, in order to reduce the process cost of manufacture of LSI chips, the process of opening the fuse window 9 is performed concurrently with the formation of openings for pads not shown as described in connection with FIG. 21. To be specific, as shown in FIG. 5, the (n+3)-rd layer of inter-level dielectric film 4, the (m+2)-nd layer of Cu diffusion barrier film 7 and the (n+2)-nd layer of inter-level dielectric film 4 are etched to form the fuse window 9 so that its bottom 10 has a size sufficient to cover the area below which the Cu fuse main body 2 is located. At this point, the (n+2)-nd layer of inter-level dielectric film 4 which, after etching, is left on the Cu fuse main body 2 to form the bottom 10 of the fuse window 9 is etched so that its thickness after etching becomes as small as possible. This allows the Cu fuse main body 2 to be blown readily by a laser beam.

In forming the fuse window 9, etching characteristics will make it easy for the top of the bottom 110 to be shaped into an arch-like form as shown in FIG. 5. As a result, even the (m+1)-st layer of Cu diffusion barrier film 7 may be etched in the periphery of the bottom 110 of the fuse window 109 to expose the (n+1)-st layer of inter-level dielectric film 4. That is, a so-called trenching phenomenon may occur in the periphery of the bottom 10 of the fuse window 9 by which the top of the Cu fuse main body 2 is exposed. As described above, however, the Cu fuse main body 2 is formed sufficiently smaller than the width (length) of the bottom 10 of the fuse window 9 and located within the area just below the bottom of the fuse window. Thus, even if the top of the bottom 10 is curved like an arch, the Cu fuse main body 2 is little exposed. Further, the Cu lead 5 is formed one layer below the Cu fuse main body 2. This eliminates the possibility that the Cu lead 5 may be exposed in the periphery of the bottom 10 of the fuse window 9. According to the first embodiment, therefore, the Cu fuse interconnect-wire 1 can be blown readily and the degradation of the quality of the Cu fuse interconnect-wire 1 which is easy to be oxidized can be suppressed significantly.

Figure 7:
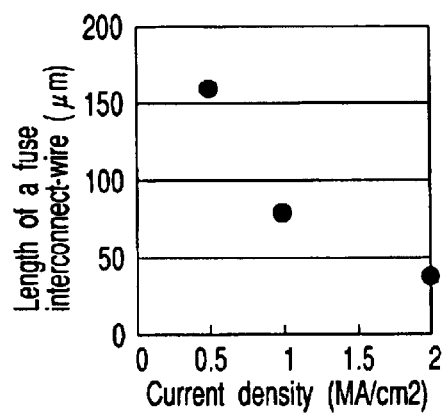
FIG. 7 is a diagram representing the relation between the density of current in a fuse interconnect-wire and the critical length of the fuse interconnect-wire.

A current may flow in the Cu fuse interconnect-wire 1. To provide for such a situation, the Cu fuse interconnect-wire 1 has such a length that does not exceed the critical length shown in FIG. 7. Specifically, the Cu fuse interconnect-wire 1 is formed so that the product of its length and a current density in that interconnect-wire is less than 80.0 μm·MA/cm². For example, suppose that the length of the Cu fuse interconnect-wire 1 is about 40 μm. Then, even if a current flows in the interconnect-wire with a current density of about 2.0 MA/cm², it becomes almost impossible for fatal electrical failures to occur. In particular, it becomes almost impossible for electromigration (EM) to occur. Thus, high-reliability Cu fuse interconnect-wires can be formed. In addition, the overall reliability of the LSI chip can be increased.

As described above, with the semiconductor device of the first embodiment, the Cu fuse interconnect-wires can be blown readily and their quality suffers little deterioration, thus providing high reliability.

[Second Embodiment]

Figure 8:
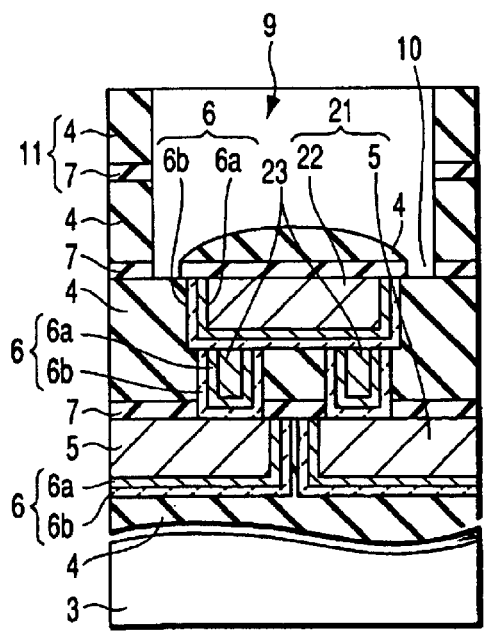
FIG. 8 is a sectional view of a semiconductor device according to the second embodiment, illustrating fuse interconnect-wires and the components provided near the wires.

FIG. 8 is a sectional view of a semiconductor device according to the second embodiment, illustrating fuse interconnect-wires and the components provided near the wires. The components identical to those shown in FIGS. 1 to 5 are designated at the same reference numerals in FIG. 8 and will not be described in detail.

The fuse interconnect-wires 21 of the second embodiment are made of Cu. As shown in the FIG. 8, the fuse main body 22 of each fuse interconnect-wire 21 is not formed integral with the contact plug (via plug) 23; it is separated from the contact plugs (via plugs) 23 are formed separately. That is, the Cu fuse main body 22 has a so-called "single damascene structure."

Up to the formation of the m-th layer of Cu diffusion barrier film 7, the process uses the same steps as with the first embodiment.

Next, a Cu fuse main body 22 of a single damascene structure is formed in the (n+1)-st layer of inter-level dielectric film 4 provided on the top of the m-th layer of Cu diffusion barrier film 7. Thus, the Cu fuse main body 22 is formed, independent of the Cu via plugs 23.

Specifically, first, a dielectric film is formed that forms a lower portion of the (n+1)-st layer of inter-level dielectric film 4. Subsequently, the lower dielectric film and the m-th layer of Cu diffusion barrier film 7 are etched in a predetermined contact pattern to thereby expose temporarily the surface of the Cu lead 5. At this point, the thickness of the lower dielectric film and the size of the recesses in the dielectric film formed by the etching process substantially correspond to the height and size, respectively, of the Cu via plugs 23. First, a barrier film 6 of two-layer structure consisting of a Ta layer 6a and a TaN layer 6b is formed in the recesses for the Cu via plugs 23. Subsequently, a film the main constituent of which is Cu that forms the seed of the Cu via plug 23 is formed on the barrier film 6 and the Cu via plugs 23 is then formed by means of electroplating. After that, excess Cu and barrier materials attached to the outside of the recesses are removed by CMP.

Subsequently, a dielectric film is formed that forms an upper portion of the (n+1)-st layer of inter-level dielectric film 4. The upper dielectric film is etched in a predetermined interconnection pattern, making a recess in the upper dielectric film. The recess has substantially the same size as the Cu fuse main body 22. A barrier film 6 of two-layer structure consisting of a Ta layer 6a and a TaN layer 6b is first formed in the recesses for the Cu fuse main body 22. Subsequently, a film the main constituent of which is Cu that forms the seed of the Cu fuse main body 22 is formed on the barrier film 6. After that, the Cu fuse main body 22 is formed by means of electro-plating. Subsequently, excess Cu and barrier materials attached to the outside of the recess are removed by CMP. Thus, the Cu fuse main body 22 of the single damascene structure is formed in the (n+1)-st layer of inter-level dielectric film 4 and the m-th layer of Cu diffusion barrier film 7 as shown in FIG. 8.

In this manner, the main portion of the Cu fuse interconnect-wire 21 is formed. The subsequent steps up to the formation of the fuse window 9 remain unchanged from those in the first embodiment. As described above, the semiconductor device of the second embodiment provides the same advantages as that of the first embodiment.

[Third Embodiment]

Figure 9:
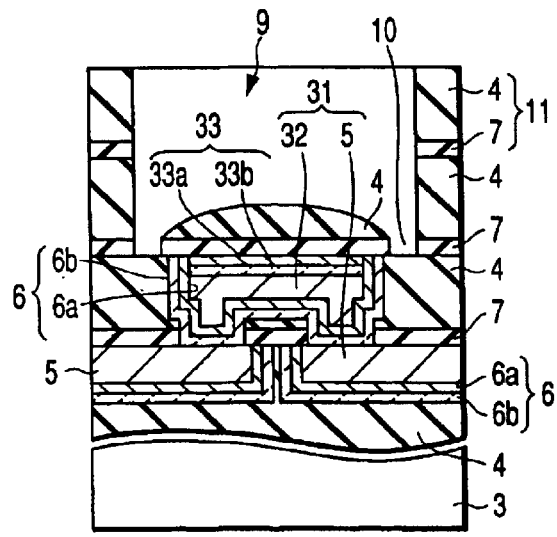
FIG. 9 is a sectional view of a semiconductor device according to the third embodiment, depicting fuse interconnect-wires and the components provided near the wires.

FIG. 9 is a sectional view of a semiconductor device according to the third embodiment, depicting fuse interconnect-wires and the components provided near the wires. The components identical to those shown in FIGS. 1 to 5 are designated at the same reference numerals in FIG. 9 and will not be described in detail.

In this embodiment as well, a fuse interconnect-wire 31 is formed of Cu. The fuse main body 32 of the fuse interconnect-wire 31 is formed on top with a top barrier film 33 for preventing oxidation and diffusion of Cu.

Up to the formation of the Cu fuse main body 32, the process remains unchanged from that in the first embodiment. Thus, the fuse main body 32 of this embodiment is the dual damascene structure.

After the formation of the Cu fuse main body 32, its top is selectively recessed by means of wet etching or dry etching. After that, the top barrier film (top barrier metal film) 33 is formed on the recessed portion, which is the two-layer structure consisting of a Ta layer 33a and a TaN layer 33b as with the barrier film 6 provided around the Cu fuse main body 32. The Ta layer 33a and the TaN layer 33b are formed by, say, sputtering. In this case, the lower layer that is in direct contact with the top of the Cu fuse main body 32 is the TaN layer 33b and the upper layer is the Ta layer 33a. After that, excess top barrier materials are removed by CMP. Thus, the Cu fuse main body 32 of the desired dual damascene structure having the top barrier film 33 is formed in the (n+1)-st layer of inter-level dielectric film 4 and the m-th layer of Cu diffusion barrier film 7 as shown in FIG. 9.

In this manner, the main part of the Cu fuse interconnect-wire 31 is formed. The subsequent steps up to the formation of the fuse window 9 remain unchanged from those in the first embodiment. As described above, in the semiconductor device of the third embodiment, since the top barrier film 33 is formed on the top of the Cu fuse main body 32, the Cu fuse interconnect-wire 31 is less easily deteriorated than in the first embodiment.

Particularly, by forming the top barrier film 33 from the Ta layer 33a and the TaN layer 33b as with the barrier film 6, its inherent function of suppressing the diffusion of Cu into inter-level dielectric films (ILD films) 4 can be effected. In addition, a film formation apparatus can be used in forming both the barrier films 6 and 33 and film forming processes can be unified and simplified. Therefore, investments in plant and equipment can be cut to reduce the manufacturing cost of semiconductor devices. Even if the barrier films 6 and 33 contact with each other, since they are made of the same materials, there is little possibility that such a reaction as causes the resistance in the Cu fuse main body 32 to increase or the barrier performance to deteriorate occurs.

Moreover, by stacking the Ta layer 33a and the TaN layer 33b, the TaN layer 33b that forms the main cause of dust produced in the process of forming the top barrier film 33 is allowed to be small in thickness. In addition to this, the pasting effect of the Ta layer 33a was found to reduce dust significantly. In general, the diffusion barrier performance depends greatly on the TaN layer 33b. However, the TaN layer, being a ceramic layer, is low in mechanical strength, i.e., fracture toughness, and is therefore very apt to break. In contrast to the TaN layer, the Ta layer 33a, being formed of a simple substance in the form of a metal, has ductility (malleability). Thus, by forming the top barrier film 33 from stacked Ta and TaN layers each in the form of a thin film, dust in the film formation process can be reduced significantly.

As described above, according to the third embodiment, the top barrier film 33 of the stacked structure of a metal layer and a ceramic layer each in the form of a thin film allows the diffusion barrier performance in the Cu fuse main body 32 to be improved. That is, the overall reliability of the semiconductor device is much improved.

[Fourth Embodiment]

Figure 10:
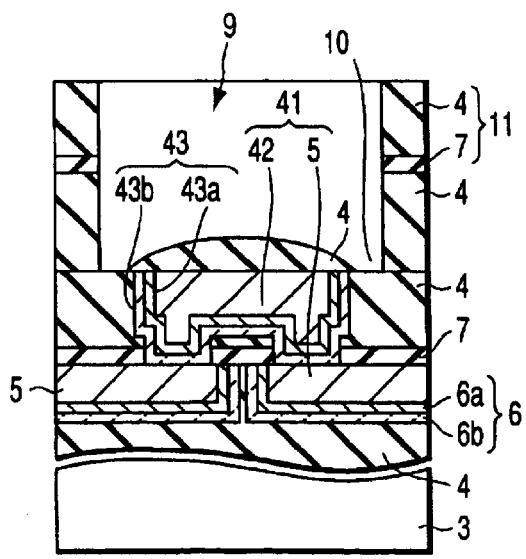
FIG. 10 is a sectional view of a semiconductor device according to the fourth embodiment, showing fuse interconnect-wires and the components provided near the wires.

FIG. 10 is a sectional view of a semiconductor device according to the fourth embodiment, showing fuse interconnect-wires and the components provided near the wires. The components identical to those shown in FIGS. 1 to 5 are denoted at the same reference numerals in FIG. 10 and will not be described in detail.

In the fourth embodiment, the fuse interconnect-wires 41 have a lead 5 that is made of Cu like the leads 5 used in the first embodiment. Nonetheless, the fuse main body 42 of each wire 41 is made of Al. The fuse main body 42 has the dual damascene structure as the fuse main body 2 of the first embodiment.

Up to the formation of a recess for the Al fuse main body 42, the process remains unchanged from that in the first embodiment. Since Al is less easy to diffuse than Cu, the fourth embodiment does not need the same barrier film as in the first embodiment. Therefore, in the recess for the Al fuse main body is first formed a barrier metal film 43 which consists of a refractory metal such as Ta, Nb, Ti, W, or Zr, or a nitride of one of such metals, or a composite thereof, and AlCu. In this embodiment, the barrier film 43 is formed into a two-layer structure of a Ta layer 43a and an AlCu layer 43b. After the formation of the barrier film 43, the fuse main body 42 is formed of Al. After that, excess Al and barrier materials are removed by CMP. Thus, the Al fuse main body 42 of the dual damascene structure is formed in the (n+1)-st layer of inter-level dielectric film 4 and the m-th layer of Cu diffusion barrier film 7 as shown in FIG. 10.

In this manner, the main part of the Cu fuse interconnect-wire 41 is formed. Since Al does not diffuse unlike Cu, there is no need to form a diffusion barrier film on the Al fuse main body 42. Therefore, the (n+2)-nd layer of inter-level dielectric film 4 is formed directly on the Al fuse main body 42. The subsequent steps up to the formation of the fuse window 9 remain unchanged from those in the first embodiment.

As described above, in the semiconductor device of the fourth embodiment, since the fuse main body 42 is formed of Al, the fuse interconnect-wire 41 is less easily deteriorated than in the first embodiment.

[Fifth Embodiment]

Figure 11:
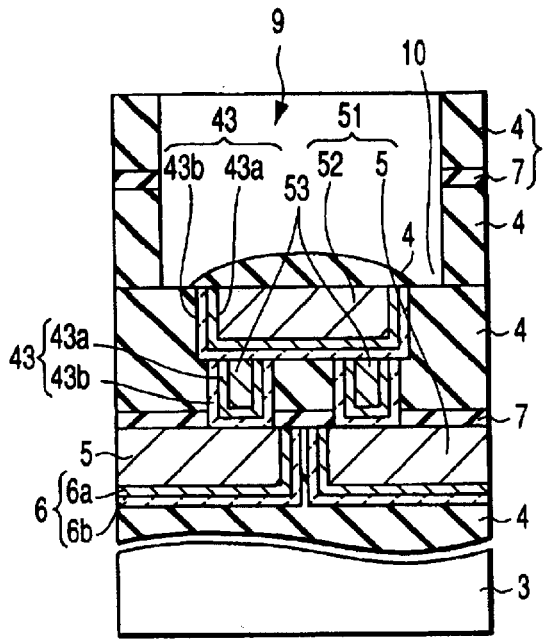
FIG. 11 is a sectional view of a semiconductor device according to the fifth embodiment, illustrating fuse interconnect-wires and the components provided near the wires.

FIG. 11 is a sectional view of a semiconductor device according to the fifth embodiment, illustrating fuse interconnect-wires and the components provided near the wires. The components identical to those shown in FIGS. 1 to 5 are designated at the same reference numerals in FIG. 11 and will not be described in detail.

In the fifth embodiment, the fuse interconnect-wires 51 have a lead 5 formed of Cu as in the first embodiment. Nevertheless, the fuse main body 52 of each wire 51 is made of Al. As seen from FIG. 11, the fuse main body 52 is separated from the Al contact plug (via plug) 53, like the Cu fuse main body 22 of the second embodiment. That is, the Al fuse main body 52 has the single damascene structure.

Therefore, the fifth embodiment can be manufactured in the same method as the second embodiment until the fuse main body 52 is formed. However, both the fuse main body 52 and the via plug 53 are made of Al, and the barrier films 43 of the same type used in the fourth embodiment are formed around fuse main body 52 and via plug 53. The subsequent steps up to the formation of the fuse window 9 are the same as in in the fourth embodiment.

As described above, in the semiconductor device of the fifth embodiment, since the fuse main body 52 is formed of Al, the fuse interconnect-wire 51 is less easily deteriorated than in the first embodiment.

[Sixth Embodiment]

Figure 12:
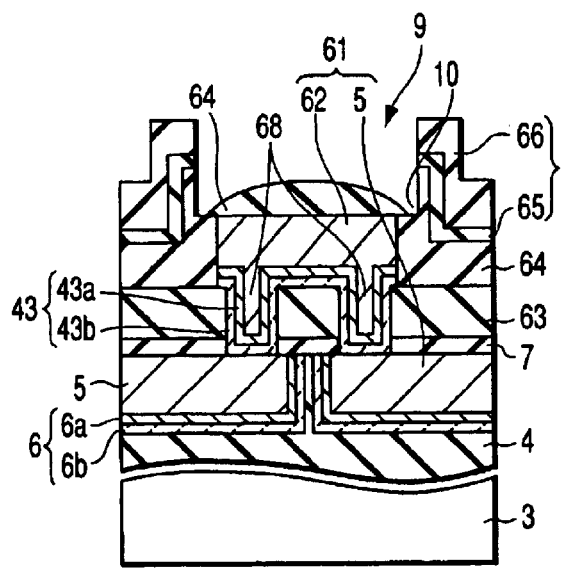
FIG. 12 is a sectional view of a semiconductor device according to the sixth embodiment, displaying fuse interconnect-wires and the components provided near the wires.

FIG. 12 is a sectional view of a semiconductor device according to the sixth embodiment, displaying fuse interconnect-wires and the components provided near the wires. The components identical to those sown in FIGS. 1 to 5 are indicated at the same reference numerals in FIG. 12 and will not be described in detail.

In the sixth embodiment as well, the fuse interconnect-wires 61 have a lead 5 that is made of Cu as leads 5 used in the first embodiment. The fuse main body 62 of each wire 61 is made of Al as the fuse main body 42 of the fourth embodiment. The fuse main body 62 is formed integral with an Al contact plug (via plug) 68, as is illustrated in FIG. 12. Further, the Al fuse main body 62 is formed by RIE process, not by damascene process.

Up to the formation of the m-th layer of Cu diffusion barrier film 7, the process remains unchanged from that in the first embodiment.

Next, a first insulating film ($SiO_2$ film) 63 is formed on the m-th layer of Cu diffusion barrier film 7. The thickness of the film 63 is about the same as the height of the Al via plugs 68. Subsequently, the first dielectric film 63 and the m-th layer of Cu diffusion barrier film 7 are etched in a predetermined contact pattern to thereby expose temporarily the surface of the Cu lead 5. At this point, the recesses made by the etching have a size substantially the same as the size of the Al via plugs 68.

Next, a barrier film 43 is formed in the recesses for the Cu via plugs 68 and on the first dielectric film 63. The barrier film 43 has two-layer structure, consisting of a Ta layer 43a and an AlCu layer 43b, which are identical to those used in the fourth embodiment. Subsequently, Al is deposited on the barrier film 43 to form the Al fuse main bodies 62 and Al via contacts 68. Then, excess Al and barrier film is removed by wet etching or dry etching in accordance with a predetermined interconnection pattern. Thus, the Al fuse main body 62, the Al via plugs 68, and the barrier film 43 are formed.

Next, a second dielectric film ($SiO_2$ film) 64 is formed on the first dielectric film 63 so as to cover the Al fuse main body 62. The interconnect-wires and pads in the topmost layer that pass through the second dielectric film 64 are formed. These wires and pads are formed in the same way as the Al fuse main body 62 and Al via plugs 68. Since Al is less easily oxidized than Cu, there is no need to form a diffusion barrier film on the Al fuse main body 62. Thus, the second dielectric film 64 is formed directly on the first dielectric film 63. Likewise, a third dielectric film ($SiO_2$ film) 65 and a fourth dielectric film (silicon nitride film) 66 are formed sequentially on the second dielectric film 64. The third dielectric film 65 and the fourth dielectric film 66 are each deposited to a predetermined thickness to form a passivation film 67.

In this manner, the main part of the fuse interconnect-wire 61 is formed. The subsequent steps up to the formation of the fuse window 9 remain unchanged from those in the first embodiment. The process of forming the fuse window 9 is performed concurrently with the formation of openings for pads.

As described above, in the semiconductor device of the sixth embodiment, since the fuse main body 62 is formed of Al, the fuse interconnect-wire 61 is less easily deteriorated than in the first embodiment.

[Seventh Embodiment]

Figure 13:
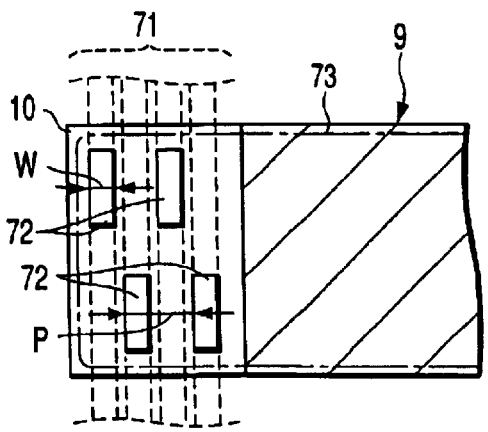
FIG. 13 is a plan view of a semiconductor device according to the seventh embodiment, depicting fuse interconnect-wires and the components provided near the wires.
Figure 14:
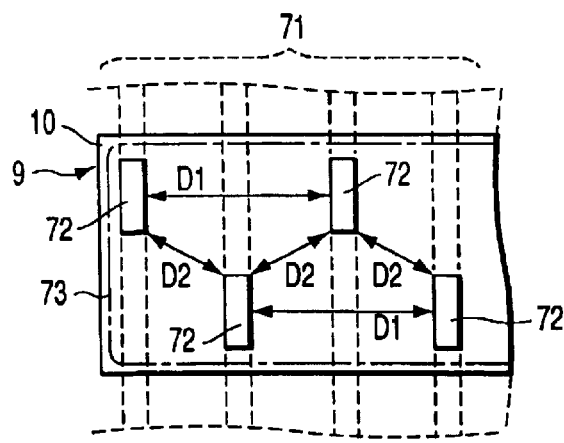
FIG. 14 is a plan view of a semiconductor device according to the seventh embodiment, illustrating another arrangement of the fuse interconnect-wires and the components.
Figure 15:
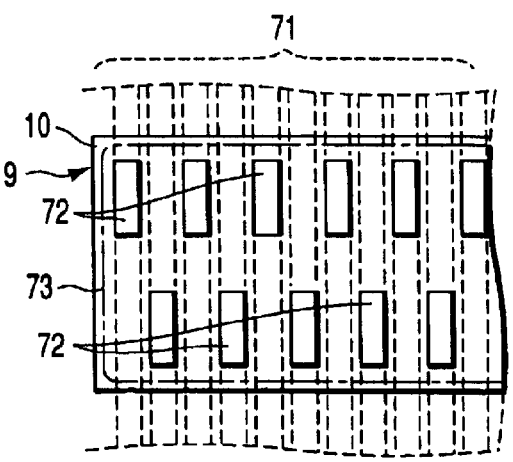
FIG. 15 is a plan view of a semiconductor device according to the seventh embodiment, illustrating still another arrangement of the fuse interconnect-wires and the components.

FIGS. 13, 14 and 15 are plan views of a semiconductor device according to the seventh embodiment, each illustrating fuse interconnect-wires and the components provided near the wires. The components identical to those shown in FIGS. 1 to 5 are designated at the same reference numerals in FIGS. 13 to 15, and will not be described in detail.

The semiconductor device of the seventh embodiment is characterized by the arrangement of fuse main bodies 72 of fuse interconnect-wires 71.

As in the first through sixth embodiments, in the seventh embodiment, the fuse interconnect-wires 71 are multi-layer structured and their fuse main bodies 72 are formed shorter than the bottom 10 of the fuse window 9. In this case, as shown in FIG. 13, the fuse interconnect-wires 71 are arranged in such a way that the main bodies 72 of the adjacent interconnect-wires are offset from each other in the direction of the length of wires so that they will not adjoin in the direction perpendicular to the direction of length. This arrangement allows the area required for the fuse interconnect-wires 71 to be reduced by the amount indicated by oblique lines in FIG. 13 without fining each interconnect-wire. That is, the fuse interconnection area can be compacted. In FIGS. 13, 14 and 15, a remaining film 73, such as an inter-level dielectric film, that forms the bottom of the fuse window 9 is present in an area indicated by dashed-and-dotted lines within the fuse window 9.

In FIG. 13, the width of the fuse interconnect-wire 71 (fuse main body 72) is set to about 0.6 µm. The spacing of the fuse main bodies 72 adjacent to each other in the direction of the width of the fuse interconnect-wires, i.e., the pitch P, is set to about 2.0 µm. The number of the fuse interconnect-wires 71 per unit area (block size) within the fuse window 9 is set to 1,000.

Figure 23:
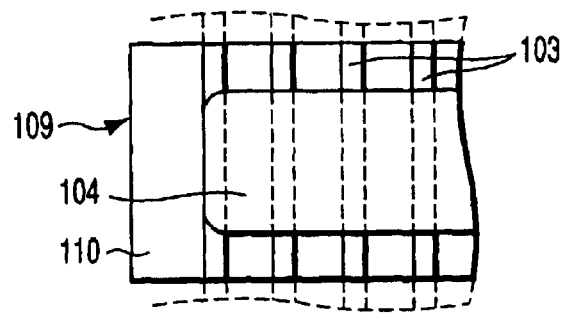
FIG. 23 is a plan view of the semiconductor device shown in FIG. 21, showing fuse interconnect-wires and the components provided near the wires, as looked from above.

With such settings, the prior art fuse interconnection structure shown in FIG. 23 will require a width of the order of 2.0 µm×1,000=2,000 µm per block size. In contrast, with the fuse interconnection structure of this embodiment in which the fuse main bodies 72 are arranged as shown in FIG. 13, the block width is allowed to be of the order of 2.0 µm×500=1,000 µm. This means that the block size can be reduced by about 50% in comparison with the prior art. Thus, the area of saving circuitry not shown that can be built into an LSI can be increased to improve the LSI saving rate.

With the fuse interconnection structure of the present embodiment, if the block size for the fuse interconnect-wires 71 remains unchanged, the spacing of the adjacent fuse main bodies 72, indicated at D1 and D2 in FIG. 13, can be increased. This will eliminate the possibility that an adjacent fuse interconnect-wire or wires may be damaged by mistake upon fuse blowing. Thus, the reliability of the fuse interconnect-wires 71 can be increased. In addition, the overall reliability of an LSI chip and the manufacturing yield can be increased.

Moreover, with the fuse interconnection structure of the present embodiment, if the block size for the fuse interconnect-wires 71 and the spacing of the adjacent fuse main bodies 72 remain unchanged, the total number of the fuse interconnect-wires in the unit area can be increased to implement high-density interconnect-wires as shown in FIG. 15. In addition, the number of fuse interconnect-wires electrically connected to saving circuitry can be increased to improve the LSI saving rate.

According to the semiconductor device of the seventh embodiment, as described above, the spacing of the fuse interconnect-wires can be reduced, i.e., the finer-pitch interconnect-wires can be implemented. In addition, the dimensions various electronic circuits in a semiconductor device can be scaled down and their density can be increased. The semiconductor device can be made compact. Thus, the size of the fuse interconnection area, the fuse pitch, and the number and density of the fuse interconnect-wires can be set suitably according to the design of electronic circuits in the semiconductor device.

In addition, the number of the fuse interconnect-wires 71 can be increased to increase their density while reducing damage to an adjacent fuse interconnection-wire or wires upon fuse blowing without enlarging the fuse interconnection area. Thereby, the reliability and manufacturing yield of semiconductor devices can be improved.

[Eighth Embodiment]

FIGS. 16 to 20 are plan views of a semiconductor device according to the eighth embodiment, each illustrating fuse interconnect-wires and the components provided near the wires. The components identical to those shown in FIGS. 1 to 5 are designated at the same reference numerals in FIGS. 16 to 20, and will not be described in detail. FIGS. 24 to 28 are plan views and sectional views of a conventional semiconductor device to be compared with the eighth embodiment, each showing fuse interconnect-wires and the components provided near the wires.

The semiconductor device of the eighth embodiment is characterized by the pattern of the fuse main bodies 82 and the leads 83 of fuse interconnect-wires 81.

Figure 24:
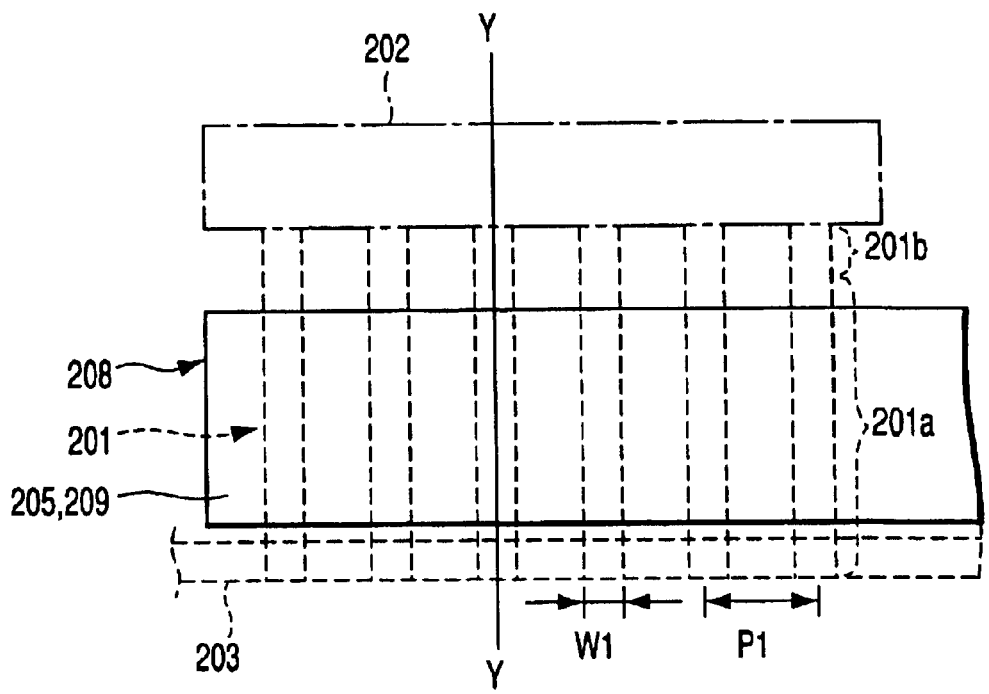
FIG. 24 is a plan view of the conventional semiconductor device, illustrating another arrangement of the fuse interconnect-wires and the components.
Figure 25:
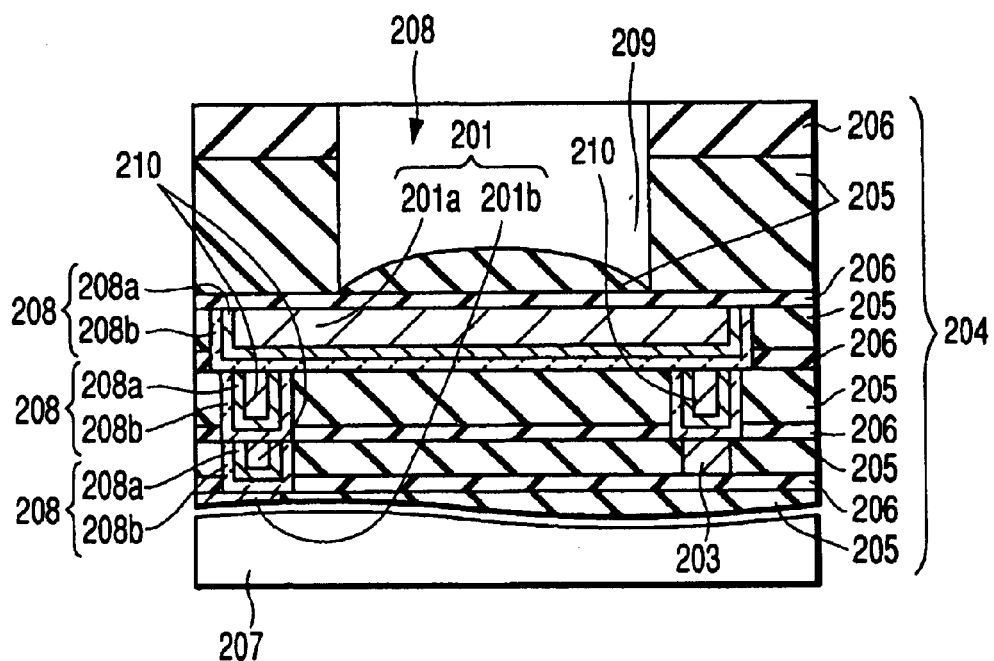
FIG. 25 is a sectional view taken along line Y—Y in FIG. 24.

First, the configuration of fuse interconnect-wires of prior art semiconductor devices will be described briefly. The structure of fuse interconnect-wires 201 heretofore used is shown in FIGS. 24 and 25. FIG. 24 is a plan view of fuse interconnect-wires in an LSI chip as a prior art semiconductor device. FIG. 25 is a sectional view taken along line Y—Y in FIG. 24.

Each of fuse interconnect-wires 201 is electrically connected, at its one end, to an electronic circuit in a semiconductor device, say, a control circuit 202 and, at its other end, to a common potential-wire 203.

In recent years, with shrinking of dimensions of semiconductor devices, the size of each of electronic circuits incorporated into the semiconductor devices has been reduced. Correspondingly, the fuse pitch has been increasingly made fine. For the replacement of defective cell elements with spare cell elements based on the redundancy technology, a laser beam-based fuse blowing technique is frequently used.

In general, to blow fuses, use is made of laser beams having a wavelength of 1047 or 1321 nm in the near infrared area. The minimum diameter of these beams depends on their wavelength. For this reason, when the fuse pitch is made so fine as to approach the diameter of a laser beam, blowing a target fuse interconnect-wire 201 may result in damage to the adjacent interconnect-wire. To prevent this, it is required to place the control circuit 202 according to fuse pitch limitations determined by the limitations of laser processing. As a result, there arises a problem that the fuse interconnect-wires 201 and the control circuit 202 take up more area than is necessary. An increase in the area of the fuse interconnect-wires 201 and the control circuit 202 results in a reduction in the scale of the saving circuitry that can be incorporated into a semiconductor chip, lowering the chip saving rate. With such an interconnection pattern as shown in FIG. 24, however, it is difficult to make the pitch of the fuse interconnect-wires 201 finer as the size of the control circuit decreases. This will be explained below by way of a specific example.

FIG. 24 is a plan view of a fuse interconnect-wire area in a prior art semiconductor device. FIG. 25 shows the sectional structure of the semiconductor device along line Y—Y in FIG. 24. The fuse interconnect-wires 201 formed on an Si substrate 207 are generally made of Cu, Cu-based alloy, Al, Al-based alloy, or the like. Usually, the fuse interconnect-wires 201 are formed of the same material as other interconnect-wires at the same layer as them and structured similarly to the other interconnect-wires. Around the fuse interconnect-wires 201 a dielectric film, such as a silicon oxide film, an organic silicon oxide film, or a silicon nitride film, which are commonly used in semiconductor devices is formed in a single layer or multiple layers.

In the semiconductor device shown in FIGS. 24 and 25, of the dielectric films 204, inter-level dielectric films 205 are each a silicon oxide film and diffusion barrier films 206 are each a silicon nitride film. The semiconductor device has five layers of dielectric films 205 and five layers of diffusion barrier films 206 formed on the Si substrate 207. The fuse interconnect-wires 201 are each made of Cu. Each of the fuse interconnect-wires 201 is formed around with a two-layered barrier film 208 consisting of a Ta layer 208a and a TaN layer 208b.

In this semiconductor device, the fuse pitch P1 shown in FIG. 24 is set to 2.5 μm and the width W1 of the main body 201a of each of the fuse interconnect-wires 201, the substantial width of the fuse interconnect-wires 201, is set to 1.0 μm. In this semiconductor device, the main body 201a of each of the fuse interconnect-wires 201 is formed in the fourth layer of dielectric film. The common potential-wire 203 is formed in, say, the second layer of dielectric film. The leads 201b of the fuse interconnect-wires 201 that provide electrical connection between the fuse interconnect-wires and the control circuit are formed in, say, the first layer of dielectric film. The fuse main bodies 201a and the common potential-wire 203 are electrically connected through contact plugs (via plugs) 210. Likewise, the fuse main bodies 201a and the leads 201b are electrically connected through contact plugs (via plugs) 210.

The dielectric film 205 remaining on the fuse interconnect-wire 201 and defining the bottom of the fuse window 208 is as thin as possible to facilitate fuse blowing. As described previously in Background of the Invention, however, the remaining film 205 is easy to be convexly curved at the bottom 209 of the fuse window 208. For this reason, the remaining film 205 is left to have such thickness that the fuse interconnect-wire 201 is not exposed in the vicinity of the periphery of that film.

Figure 26:
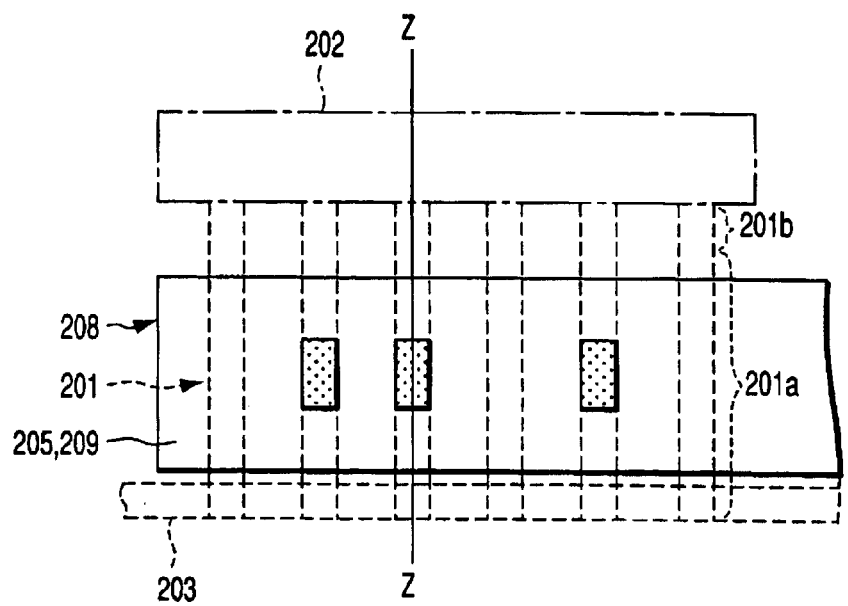
FIG. 26 is a plan view of the device shown in FIG. 24, illustrating the fuse interconnect-wires that have been blown.
Figure 27:
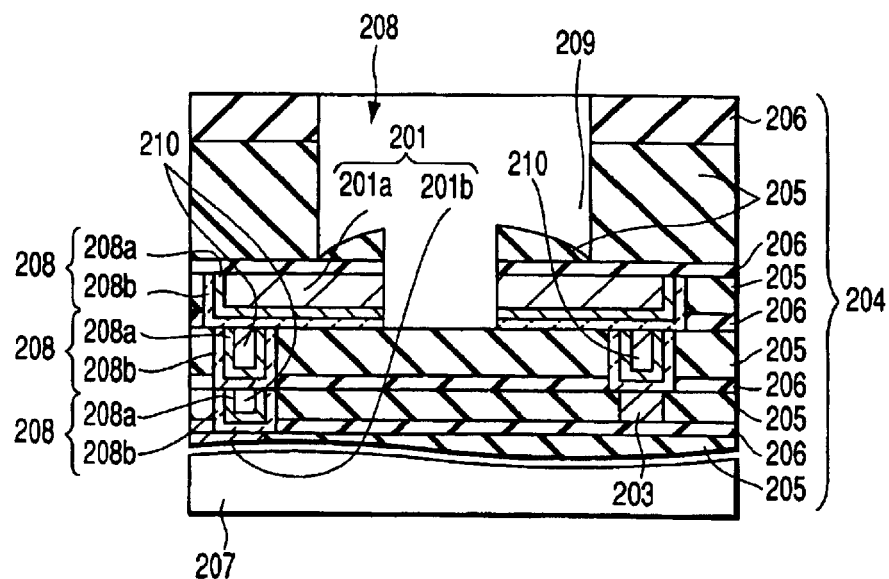
FIG. 27 is a sectional view taken along line Z—Z in FIG. 26.

FIGS. 26 and 27 show the state after coordinate-specified fuse interconnection-wires of the fuse interconnect-wires 201 shown in FIGS. 24 and 25 have been blown. FIG. 26 schematically shows, in plan view, the vicinity of the fuse interconnect-wires which have been flown. FIG. 27 is a sectional diagram taken along line Z—Z in FIG. 26.

In FIG. 26, the dotted portions of the fuse interconnect-wires 201 indicate blown portions. The wavelength of a laser beam used in this fuse blowing process was 1321 nm, the beam diameter was 3.0 μm, and the alignment tolerance was ±0.35 μm. Such settings show that target fuse interconnect-wires can be disconnected with little damage to adjacent fuse interconnect-wires or other area.

Figure 28:
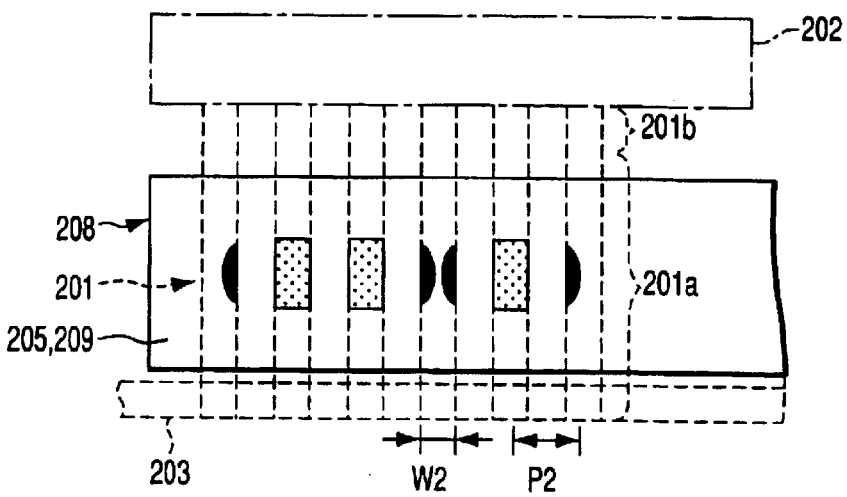
FIG. 28 is a plan view of the device shown in FIG. 24, depicting the fuse interconnect-wires arranged at a shorter pitch and having been blown.

Consider the case where the fuse pitch P2 is reduced to 2.0 μm with the width W2 of the fuse interconnect-wire main bodies 201a kept at 1.0 μm as shown in FIG. 28. Trying to blow target fuse interconnect-wires 201 under such settings results in damage to adjacent fuse interconnect-wires as indicated by blackened areas. If, to prevent this, the energy of a laser beam is lowered, the target fuse interconnect-wires 201 will not be disconnected. Thus, setting the wavelength of a laser beam to 1321 nm, the beam diameter to 3.0 μm, and the alignment tolerance to ±0.35 μm in the conventional interconnection pattern makes it substantially impossible to fine the fuse pitch down to 2.0 μm.

The eighth embodiment is directed to a semiconductor device which allows such problems as described above to be overcome. Its object is to provide a fuse interconnect-wire structure which permits fuse interconnect-wires to be arranged in an appropriate pattern according to microstructuring of various electronic circuits in the semiconductor device regardless of the precision limitations of laser beam-based fine processing. Another object is to provide a fuse interconnect-wire structure that permits fuse blowing speed to be increased.

Figure 16:
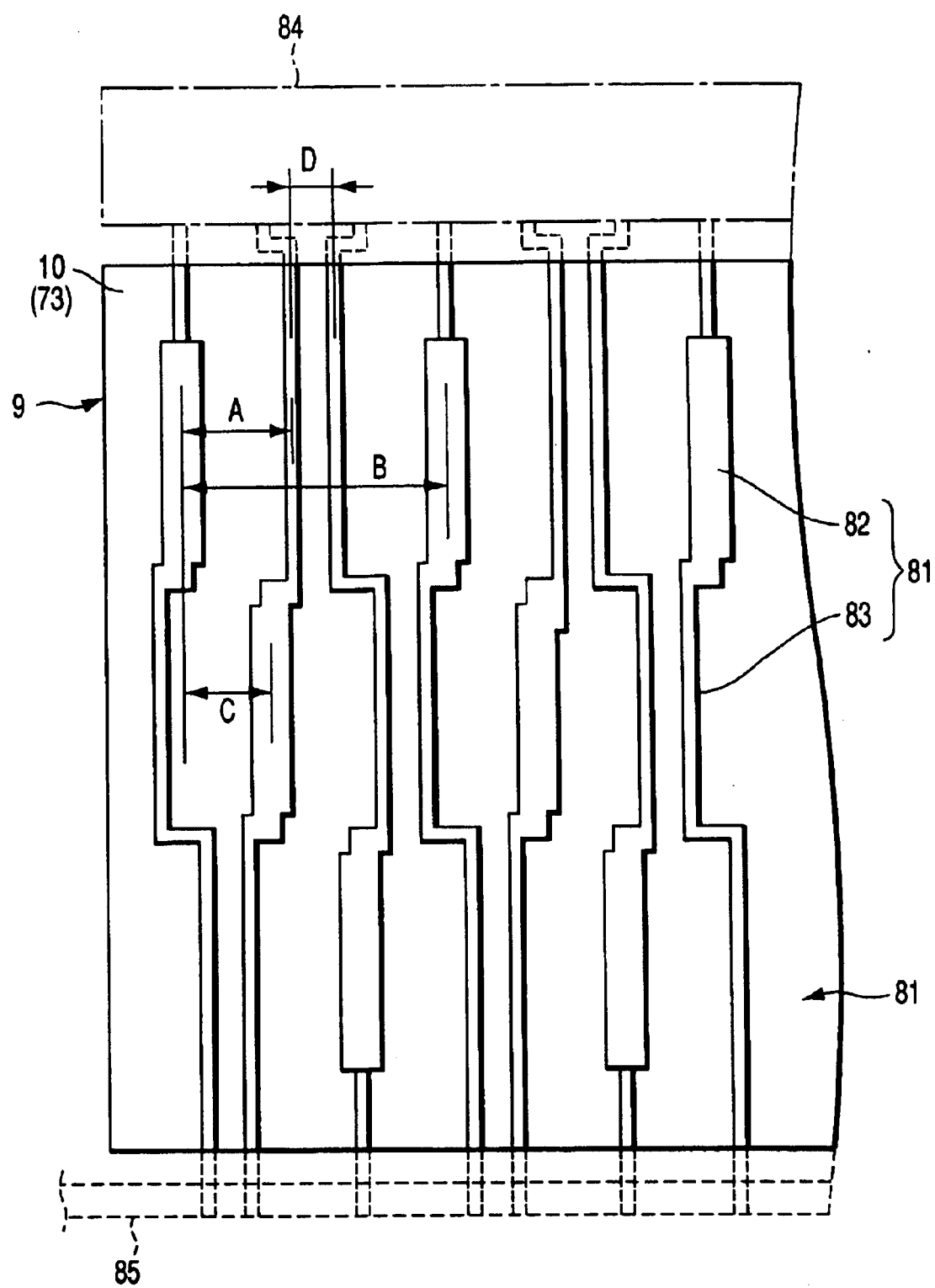
FIG. 16 is a plan view of a semiconductor device according to the eighth embodiment, depicting fuse interconnect-wires and the components provided near the wires.
Figure 17:
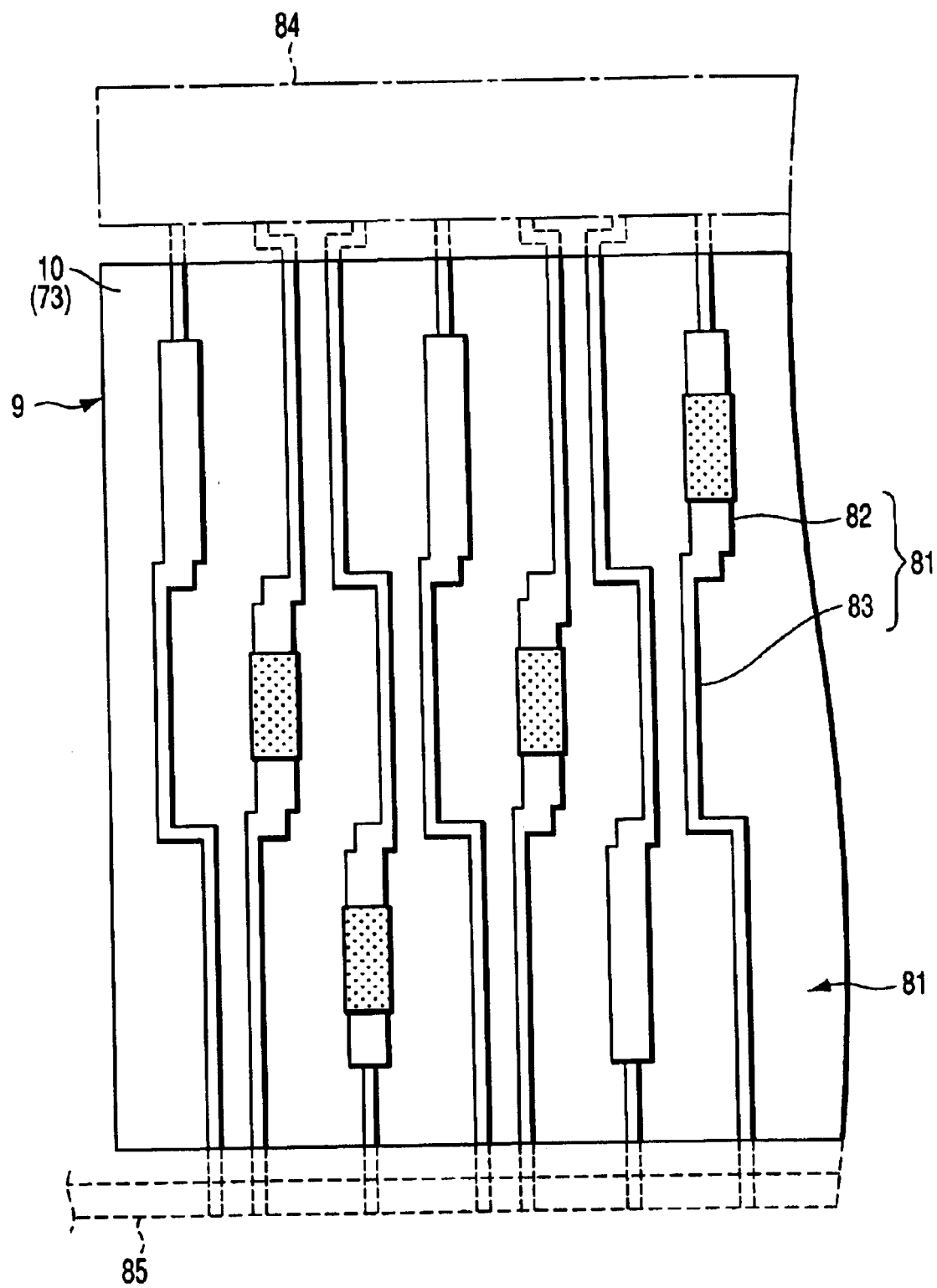
FIG. 17 is a plan view of the device shown in FIG. 16, showing the fuse main bodies of the fuse interconnect-wires, which have been blown.
Figure 18:
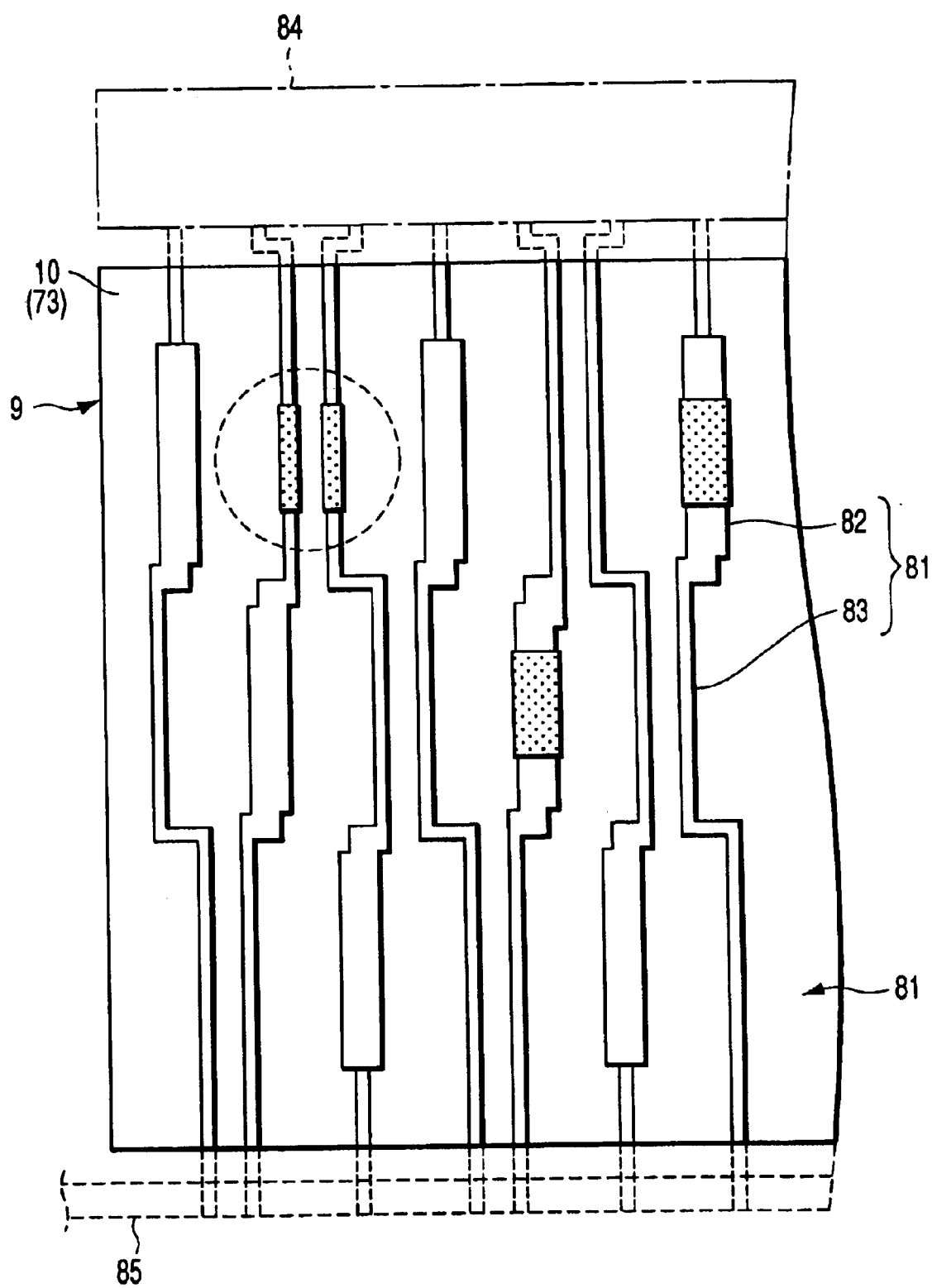
FIG. 18 is a plan view of the device shown in FIG. 16, showing the fuse main bodies and leads of the fuse interconnect-wires, which have been blown.

FIGS. 16, 17 and 18 illustrate, in plan view as viewed from above the fuse window, the structure of the vicinity of fuse interconnect-wires 81 in the semiconductor device of the eighth embodiment.

As shown in FIGS. 16 to 18, the fuse main bodies 82 of the respective fuse interconnect-wires 81 are formed in first, second and third rows that are arranged in this order from the side of the control circuit 84 toward the side of the common potential-wire 85. The leads 83 of the respective fuse main bodies 82 of the second row extend between the fuse main bodies of the first row and are electrically connected to the control circuit 84. The leads 83 of the respective fuse main bodies 82 of the third row extend between the fuse main bodies of the first and second rows and are electrically connected to the control circuit 84.

Likewise, the leads 83 of the respective fuse main bodies 82 of the second row extend between the fuse main bodies of the third row and are electrically connected to the common potential-wire 85. The leads 83 of the respective fuse main bodies 82 of the first row extend between the fuse main bodies of the second and third rows and are electrically connected to the common potential-wire 85. In this embodiment, the center-to-center spacing between each fuse main body and the adjacent lead, indicated at A in FIG. 16, is set to, say, about 2.5 μm.

The fuse main bodies 82 are as broad as or broader than the leads 83. In other words, the width of each lead 83 is be smaller than or equal to the width of each fuse main body 82. This makes it possible not only to facilitate fuse blowing but also to provide greater freedom in the layout of the leads 83 (or the fuse interconnect-wires 81). Thus, the fuse interconnect-wires 81 can be provided in a more appropriate pattern according to connected conditions of various electronic circuits in an LSI chip.

In general, increasing the width of the fuse main bodies to about 1.0 μm allows damage to underlying $SiO_2$ films and inter-level dielectric films due to fuse blowing to be suppressed. However, the fuse blowing becomes difficult. In contrast, if the width of the fuse main bodies is reduced to about 0.5 μm, the fuse blowing becomes easy, but damage to underlying layers due to fuse blowing becomes liable to occur. Therefore, the width of the fuse main bodies has a value that allows for both fuse blowing and damage suppression according to the wavelength of a laser beam, the alignment tolerances, or the thickness of underlying layers. For example, suppose that the wavelength of a fuse blowing laser beam is 1321 nm. In this case, it is thought that the appropriate width of the fuse main bodies ranges from about 0.4 to about 1.0 µm.

Even if the width of the fuse main bodies is narrowed down to about 0.5 µm, underlying Si may be little damaged. Furthermore, even if the leads and the fuse main bodies are formed to have substantially the same width, the degree of freedom in the layout of the leads can be ensured in some cases. When the two cases are allowed for, the fuse main bodies and the leads may have substantially the same width. However, making the width of the leads larger than that of the fuse main bodies is not desirable because it increases the possibility that the fuse blowing performance may be degraded and the degree of freedom in the layout of the leads may be lowered.

The spacing of the two leads 83 extending between the two fuse main bodies 82 of the first row, indicated at D in FIG. 16, is set to, say, about 1.0 µm. Then, the spacing of the adjacent fuse main bodies 82 of the first row, indicated at B in FIG. 16, will be about 6 µm. As a result, three fuse interconnect-wires 81 can be placed within a width of about 6 µm in the first row. This is the case with the second and third rows. Thus, according to the interconnection pattern of this embodiment, the substantial pitch of the adjacent fuse interconnect-wires 81, indicated at C in FIG. 16, can be reduced to about 2.0 µm.

FIG. 17 shows the state where the fuse main bodies of target ones of the fuse interconnect-wires 81 shown in FIG. 16 have been blown. In this fusing process, the wavelength of a fuse blowing laser beam was set to 1321 nm, the beam diameter was set to about 3.0 µm, and the alignment tolerance was set to ± about 0.35 µm. In FIG. 17, the fuse blown portions are indicated dotted. From FIG. 17, it can be seen that the interconnection pattern of this embodiment allows only target fuse interconnect-wires to be disconnected. Therefore, the present embodiment can provide fine-pitch interconnect-wires without making the film left on each fuse interconnect-wire small in thickness or without coping with the limitations encountered in making fine the fuse interconnect-wire pitch.

In using the fuse interconnect-wire pattern of the present embodiment, each fuse main body and its associated leads may be formed in the same layer. In this case, the spacing of adjacent leads is set equal to or smaller than the beam diameter. That is, corresponding portions of two adjacent leads are formed within a laser beam irradiated area as indicated by a broken circle in FIG. 18. If, under such conditions, a laser beam is directed onto that area, then two fuse interconnect-wires can be blown simultaneously as indicated by dotted portions on their respective leads. That is, two fuse interconnect-wires can be disconnected simultaneously in a single fuse blowing. This can increase the fuse-blowing throughput.

Figure 19:
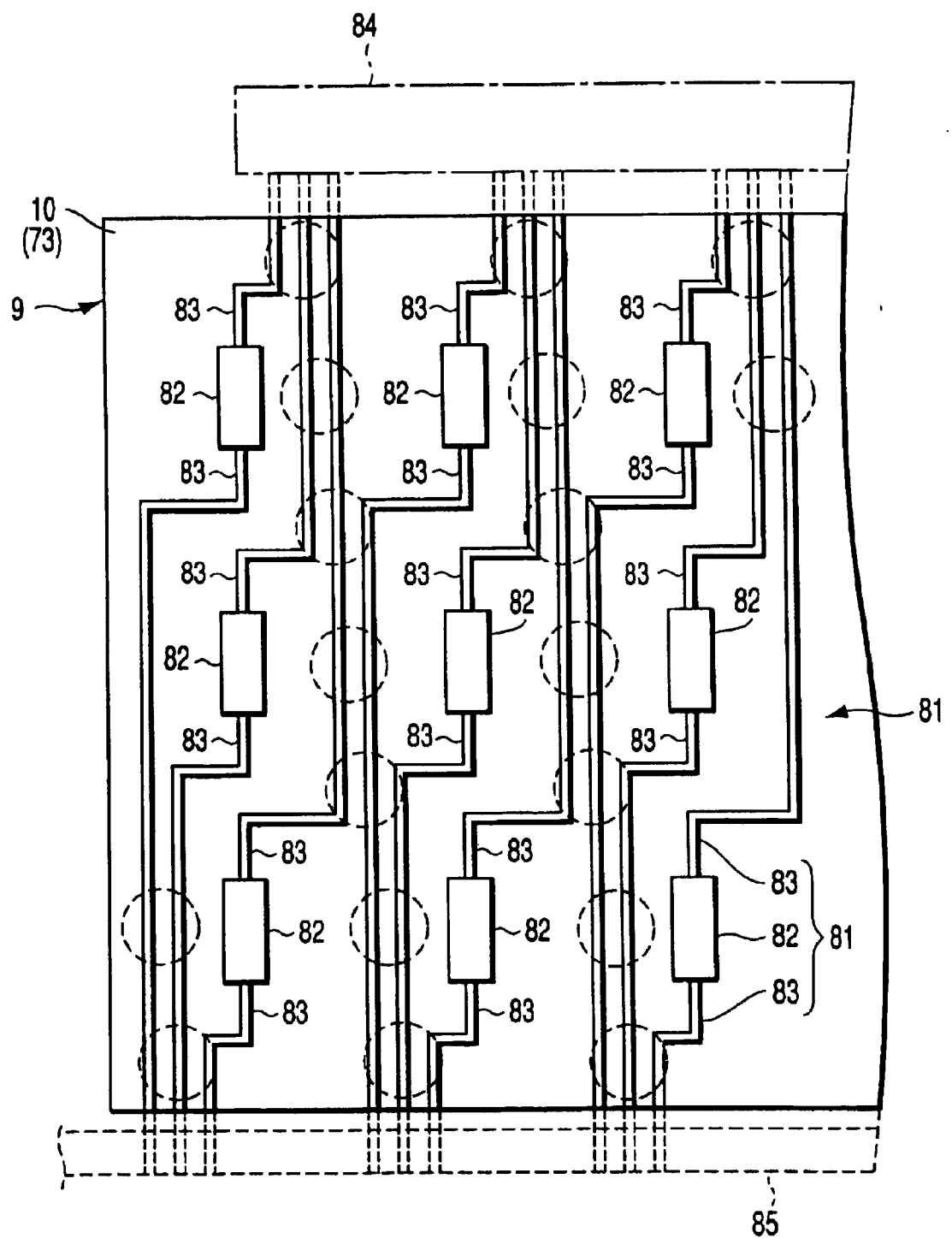
FIG. 19 is a plan view of the semiconductor device according to the eighth embodiment, illustrating another arrangement of the fuse interconnect-wires and the components.
Figure 20:
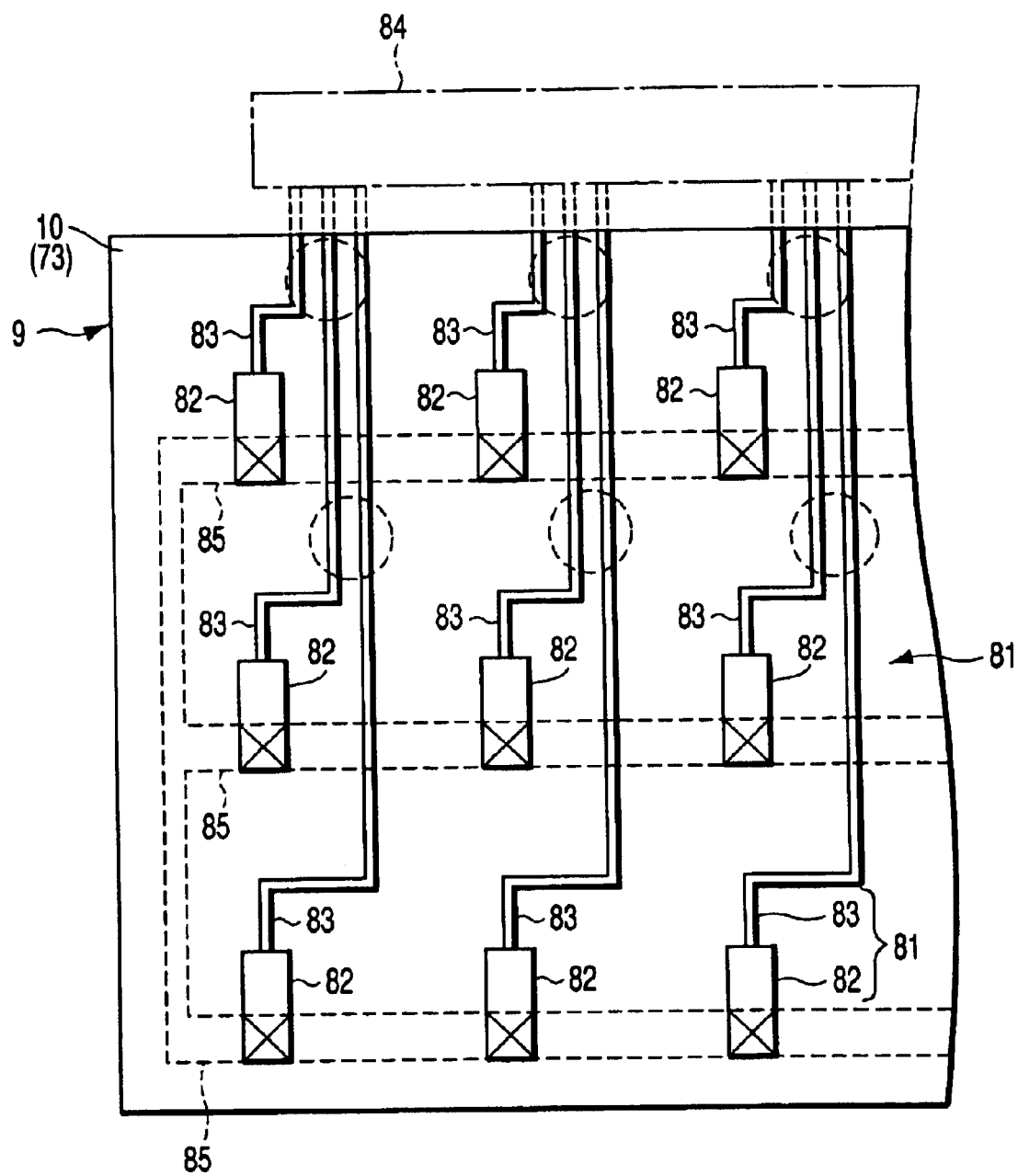
FIG. 20 is a plan view of a semiconductor device according to the eighth embodiment, illustrating still another arrangement of the fuse interconnect-wires and the components.

Furthermore, the fuse interconnect-wires 81 may be formed in such patterns as shown in FIGS. 19 and 20. The size of a laser beam irradiated area corresponds to the size of a broken circuit shown in FIGS. 19 and 20. Portions encompassed by broken circles set as targets at given spots on the fuse interconnect-wires 83 are blown. Thus, two or three fuse interconnect-wires 83 can be disconnected simultaneously in a single fuse blowing operation.

In the interconnection patterns of FIGS. 19 and 20, the fuse interconnect-wires 81 are arranged such that those fuse main bodies of three adjacent fuse interconnect-wires that are placed in the first, second and third rows are substantially aligned with one another along the longitudinal line of the fuse interconnect-wires. Further, the leads 83, the width of which is equal to or smaller than the width of the fuse main bodies 82, extend between the fuse main bodies in each row. Thereby, the fuse interconnection structure can be provided which, even if the fuse main bodies 82 and the leads 83 are formed in the same layer, allows a target fuse interconnect-wire to be blown properly and efficiently while suppressing damage to adjacent fuse interconnect-wires due to the fuse blowing. The provision of the fuse interconnection structure that can provide greater freedom in the interconnection pattern according to the circuit design of a semiconductor device allows the reliability and yield to be increased.

As shown in FIGS. 19 and 20, the fuse main bodies 82 may be arranged so that they are substantially aligned with one another not only in the direction of length of the fuse interconnect-wires but also in a direction perpendicular to the direction of length of the fuse interconnect-wires. That is, the fuse main bodies 82 are arranged in the form of a matrix so that they are substantially aligned with one another in the directions of length and width of the fuse interconnect-wires. This allows fuse-blowing operations to be performed properly and efficiently.

In the fuse interconnection structure shown in FIG. 20, the fuse main bodies 82 in each of the first, second and third rows are electrically connected to a respective one of common potential-wires 85 each corresponding to one of the three rows. Each common potential-wire is formed below the corresponding fuse main bodies in the area below the bottom 10 of the fuse window 9. The common potential-wires 85 are connected together at their ends. Each of the fuse main bodies 82 is electrically connected to the corresponding common potential-wire 85 by a contact plug (not shown) indicated with a cross (X) in FIG. 20 and formed in the direction perpendicular to the sheet of paper.

In this embodiment, the pattern of the fuse interconnect-wires 81 is not limited to those shown in FIGS. 16 to 20. The fuse interconnect-wires can be formed in any other shape, size and pattern so that more interconnect-wires can be blown simultaneously in a single fuse blowing operation. The distance between the fuse main body and the lead may be set to a suitable value according to the wavelength of a fuse blowing laser beam, the beam diameter, and the alignment tolerances.

In this embodiment, the remaining film 73 above the fuse interconnect-wire 81 that forms the bottom 10 of the fuse window 9 is formed into such shape and thickness that the periphery of the bottom of the fuse window is not exposed as shown in FIGS. 16 to 20. If the fuse interconnect-wires 81 are formed of Cu and the fuse main bodies and the leads are formed in the same layer, the leads are formed in at least one layer lower layer in the vicinity of the periphery of the bottom 10 of the fuse window 9. Thereby, even if the trenching phenomenon occurs at the bottom 10 of the fuse window 9, the possibility of deterioration of the fuse interconnect-wires 81 can be reduced significantly.

As described above, the eighth embodiment can attain the same advantages as the seventh embodiment. Specifically, with the eighth embodiment it is possible to decrease the pitch of the control circuit 84 for redundancy. By forming the fuse main bodies 82 and the leads 83 at the same layer, two or more adjacent fuse interconnect-wires 81 can be cut in a single fuse blowing operation, allowing fuse blowing throughput to be improved.

The semiconductor device of the present invention is not limited to the first through eighth embodiments described so far. The configurations, steps and settings in these embodiments can be modified or combined variously and appropriately.

For example, the layer in which the fuse interconnect-wires are formed is not limited to the layer one layer lower than the topmost layer. With a semiconductor device of the multi-layered interconnection structure, the fuse interconnect-wires may be formed in any layer where fuse blowing is easy and the degradation of the quality of the fuse interconnect-wires is suppressed. The leads do not need to be formed in the same layer as or in the layer one layer lower than the fuse main bodies for all the fuse interconnect-wires. Each lead may be formed in a different layer. The same thing can be said of the case where two or more leads are drawn out of one fuse main body. In these cases, each lead may be drawn stepwise so that the farther away it is from the corresponding fuse main body, the farther down it goes. The same applies to the common potential-wire.

To connect a fuse main body and its associated lead which are formed in different layers, a via plug (contact plug) is simply formed in the intervening layer or layers. The same thing can be said of the case where the lead and the common potential-wire which are formed in different layers are electrically connected with each other.

The number of leads drawn out of one fuse main body is not limited to one or two. To allow predetermined circuits in a semiconductor device to be interconnected in two or more patterns, four leads may be drawn out of each of two or more fuse main bodies. Of these leads, predetermined ones are simply formed to adjoin one another within an area smaller than the diameter of a fuse blowing laser beam. Thereby, the disconnection patterns of fuses can be increased without lowering the fuse blowing efficiency. In addition, fuse blowing can be performed in selected areas where fuse blowing has little influence on other areas. That is, the quality of semiconductor devices can be improved without lowering the fuse blowing efficiency.

The structure of the fuse main bodies is not limited to the dual damascene structure, the single damascene structure, or the RIE structure. The fuse main body and the via plug may be of substantially the same size and shape.

As the material of the fuse interconnect-wires, any material can be selected according to their structure and the shape of the bottom of the fuse window so long as the resulting fuse interconnect-wires become difficult to be deteriorated. For example, when the thickness of the film left at the bottom of the fuse window is small and consequently there is the possibility that the periphery of the bottom may be exposed, it is desirable to form the fuse main bodies of the fuse interconnect-wires from Al. In particular, where the fuse main bodies and the leads are formed at the same layer, the use of Al for the fuse main bodies allows the deterioration of the fuse interconnect-wires to be suppressed very well. On the other hand, when the thickness of the film left at the bottom of the fuse window is large and consequently there is little possibility that the periphery of the bottom is exposed, it is desirable to form the fuse main bodies of the fuse interconnect-wires from Cu. Thereby, the electrical properties of the fuse interconnect-wires can be improved. The use of a metal other than Al or Cu which has substantially the same characteristics as Al or Cu for the fuse interconnect-wires will also provide the same advantages as the embodiments described above. For example, the fuse interconnect-wire may be made of Cu-based alloy, Al-based alloy, or the like.

When the fuse main bodies are the single damascene structure, each of the fuse main body and the via plug may be formed of a different material. In this case, the via plug are made of a metal having a higher melting point than the material of the fuse main body. For example, the via plug may be made of a refractory metal.

The smaller the diameter of the via plug that connects a fuse main body to its associated lead, the smaller the width of the lead can be made. By making the width of the lead equal to or smaller than the width of the fuse main body, the effect of blowing a fuse interconnect-wire on its periphery can be decreased.

The barrier film is not limited to a pair of Ta and TaN. For example, the barrier film may be formed of a pair of Ti and TiN, Nb and NbN, W and WN, or Zr and ZrN. The layer consisting of a compound may be formed of not only a nitride but also a carbide or boride of Ta, Ti, Nb, W, or Zr. That is, an element in the group IVa, Va, and VIa elements and its compound are selectively used according to the material of the fuse interconnect-wires. Further, the top barrier film may be formed on the top of the Al fuse main bodies. This allows the quality of the fuse main bodies to become far less easily degraded.

A ray of light used in fuse blowing is not limited to a laser beam which is set as described previously. Use can be made of various rays of light which include:

the fundamental wave of Q-switched Nd: YAG laser (wavelength: 1064 nm), the second, third and fourth harmonics of Q-switched Nd: YAG laser (wavelength: 532, 355 and 248 nm), KrF excimer laser (wavelength: 190 nm), ArF excimer laser (wavelength: 190 nm), etc. That is, any ray of light can be used provided that it can be narrowed down to a diameter small enough to selectively blow a target fuse interconnect-wire or wires.

Additional advantages and modifications will readily occur to those skilled in the art. Therefore, the invention in its broader embodiments is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a substrate;
   a plurality of dielectric films formed on the substrate, laid one upon another; and
   a fuse interconnect-wire formed above the substrate and covered with a predetermined one of the dielectric films, and including a fuse main body which is to be blown to electrically disconnect the fuse interconnect-wire, which is smaller than a bottom of a fuse-blowing recess made in the predetermined dielectric film, which has a length more than the diameter of a fuse-blowing laser beam and which opposes the bottom of the fuse-blowing recess.

2. The device according to claim 1, wherein the fuse interconnect-wire further includes a fuse lead which is electrically connected to the fuse main body and which is formed in a layer lying below a layer in which the fuse main body is formed.

3. The device according to claim 1, wherein the fuse interconnect-wire further includes a fuse lead which is electrically connected to the fuse main body, which has a width not larger than that of the fuse main body and which is formed in the same layer as the fuse main body.

4. The device according to claim 1, which further comprises additional fuse interconnect-wires extending substantially parallel to the fuse interconnect-wire, and in which the fuse main bodies of any adjacent fuse interconnect-wires are offset from each other in a direction perpendicular to the lengthwise direction of the fuse interconnect-wires.

5. The device according to claim 1, which further comprises additional fuse interconnect-wires extending substantially parallel to the fuse interconnect-wire, and in which the fuse main bodies of at least two of the fuse interconnect-wires are substantially aligned with each other in the lengthwise direction of the fuse interconnect-wires.

6. The device according to claim 1, which further comprises additional fuse interconnect-wires extending substantially parallel to the fuse interconnect-wire, and in which the fuse main bodies of the fuse interconnect-wires are arranged in the form of a matrix, in two directions substantially parallel to the lengthwise and widthwise directions of the fuse interconnect-wires, respectively.

7. The device according to claim 1, wherein the fuse interconnect-wire is formed such that the product of its length and the density of current in it is equal to or smaller than $80.0 \ \mu m \cdot MA/cm^2$.

8. The device according to claim 1, wherein the fuse interconnect-wire is made of Al or Al-based alloy.

9. The device according to claim 1, wherein the fuse interconnect-wire is made of Cu or Cu-based alloy.

10. The device according to claim 2, which further comprises a plug which electrically connects the fuse main body to the fuse lead, and in which the fuse main body and the plug are formed integral with each other and buried in a layer lying above the layer in which the fuse lead is formed.

11. The device according to claim 2, which further comprises a plug which electrically connects the fuse main body to the fuse lead, and in which the fuse main body and the plug are separated from each other and buried in a layer lying above the layer in which the fuse lead is formed.

12. The device according to claim 2, which further comprises a plug which electrically connects the fuse main body to the fuse lead, and in which the fuse main body and the plug are formed integral with each other by etching and provided in a layer lying above the layer in which the fuse lead is formed.

13. The device according to claim 4, wherein the fuse main bodies of at least two of the fuse interconnect-wires are substantially aligned with each other in a direction perpendicular to the lengthwise direction of the fuse interconnect-wires.

14. The device according to claim 9, further comprising a barrier film which formed on the fuse main body.

15. The device according to claim 10, wherein the plug has a diameter not larger than the width of the fuse main body.

16. A semiconductor device comprising:
a plurality of dielectric films formed on a substrate, laid one upon another; and
a fuse interconnect-wire which is formed above the substrate and covered with a predetermined one of the dielectric films, and which comprises a fuse lead and a fuse main body electrically connected to the fuse lead, the fuse main body lying below a bottom of a fuse-blowing recess made in the predetermined dielectric film and above the fuse lead, having a length more than the diameter of a fuse-blowing laser beam, and having both ends within an area opposite the bottom of the fuse-blowing recess, said both ends being spaced apart in the lengthwise direction of the fuse main body.

17. A semiconductor device comprising:
a plurality of dielectric films formed on a substrate, one laid upon another; and
a fuse interconnect-wire which is formed above the substrate and covered with a predetermined one of the dielectric films, and which comprises a fuse lead and a fuse main body electrically connected to the fuse lead, the fuse main body lying below a bottom of a fuse-blowing recess formed in the predetermined dielectric film, being provided in the same layer as the fuse lead, having a length more than the diameter of a fuse-blowing laser beam and a width not less than that of the fuse lead, and having both ends within an area opposite the bottom of the fuse-blowing recess, said both ends being spaced apart in the lengthwise direction of the fuse main body.

18. The device according to claim 17, wherein the fuse lead extends from the fuse main body toward the outside of the area opposite the bottom of the fuse-blowing recess.

19. The device according to claim 17, which further comprises additional fuse interconnect-wires extending substantially parallel to the fuse interconnect-wire, and in which the fuse leads of at least two fuse interconnect-wires lie close to each other within an area not larger than an area to which the fuse-blowing laser beam is applied and are provided within the area opposite the bottom of the fuse-blowing recess.

20. The device according to claim 19, wherein the fuse main body has an end electrically connected by a corresponding fuse lead to an electronic circuit that is provided outside the area opposite the bottom of the fuse-blowing recess.

* * * * *